(12) United States Patent
Yang et al.

(10) Patent No.: US 11,903,258 B2
(45) Date of Patent: Feb. 13, 2024

(54) DISPLAY SUBSTRATE AND PREPARATION METHOD THEREOF, AND DISPLAY DEVICE

(71) Applicant: BOE Technology Group Co., Ltd., Beijing (CN)

(72) Inventors: Shengji Yang, Beijing (CN); Hui Wang, Beijing (CN); Xiaochuan Chen, Beijing (CN); Kuanta Huang, Beijing (CN); Pengcheng Lu, Beijing (CN); Yuncui Zhao, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 192 days.

(21) Appl. No.: 16/902,288

(22) Filed: Jun. 16, 2020

(65) Prior Publication Data
US 2021/0066416 A1 Mar. 4, 2021

(30) Foreign Application Priority Data
Aug. 30, 2019 (CN) .......................... 201910813605.5

(51) Int. Cl.
*H10K 59/122* (2023.01)
*H10K 59/38* (2023.01)
(Continued)

(52) U.S. Cl.
CPC ........... *H10K 59/122* (2023.02); *H10K 59/38* (2023.02); *H10K 71/00* (2023.02); *H10K 59/1201* (2023.02)

(58) Field of Classification Search
CPC ... H01L 27/3246; H01L 27/322; H01L 51/56; H01L 2227/323; H10K 59/122; H10K 59/38; H10K 59/1201; H10K 71/00
See application file for complete search history.

(56) References Cited

U.S. PATENT DOCUMENTS 5,920,080 A * 7/1999 Jones ................... H10K 50/846
257/40
2010/0052524 A1 3/2010 Kinoshita
(Continued)

FOREIGN PATENT DOCUMENTS

CN 101661951 A 3/2010
CN 102956673 A 3/2013
(Continued)

OTHER PUBLICATIONS

Office Action dated May 6, 2021 for Chinese Patent Application No. 201910813605.5 and English Translation.

*Primary Examiner* — Shaun M Campbell
(74) *Attorney, Agent, or Firm* — Ling Wu; Stephen Yang; Ling and Yang Intellectual Property

(57) ABSTRACT

Provided are a display substrate and a preparation method thereof, and a display device. The display substrate includes a plurality of pixel units arranged in a matrix, wherein the pixel units each include a plurality of sub-pixels, the sub-pixels each include a micro-cavity modulation layer and an emitting structure layer, the micro-cavity modulation layer is provided with a reflective electrode, the emitting structure layer includes a first electrode, an emitting layer and a semi-transparent and semi-reflective second electrode which are sequentially disposed on the micro-cavity modulation layer, and a distance between the second electrode and the reflective electrode is different in each sub-pixel.

16 Claims, 8 Drawing Sheets

(51) Int. Cl.
*H10K 71/00* (2023.01)
*H10K 59/12* (2023.01)

(56) References Cited

U.S. PATENT DOCUMENTS

| | | |
|---|---|---|
| 2013/0048986 A1 | 2/2013 | Lee et al. |
| 2014/0117860 A1* | 5/2014 | Kim .................. H01J 9/50 |
| | | 445/2 |
| 2014/0183460 A1 | 7/2014 | Kim et al. |
| 2018/0219170 A1 | 8/2018 | Kato et al. |
| 2019/0189701 A1 | 6/2019 | Bang et al. |
| 2020/0027932 A1* | 1/2020 | Choi ................. H01L 27/3213 |
| 2020/0099013 A1 | 3/2020 | Wang et al. |
| 2020/0144548 A1* | 5/2020 | Xia .................. H10K 50/818 |
| 2021/0098733 A1* | 4/2021 | Baik ................. H01L 27/3211 |
| 2021/0202883 A1* | 7/2021 | Zhang .............. H01L 27/3211 |
| 2021/0359036 A1* | 11/2021 | You ................. H10K 50/818 |

FOREIGN PATENT DOCUMENTS

| | | |
|---|---|---|
| CN | 103915468 A | 7/2014 |
| CN | 107195584 A | 9/2017 |
| CN | 107852788 A | 3/2018 |
| CN | 108461643 A | 8/2018 |
| CN | 109273619 A | 1/2019 |
| CN | 109285970 A | 1/2019 |
| CN | 110021637 A | 7/2019 |

\* cited by examiner

US 11,903,258 B2

DISPLAY SUBSTRATE AND PREPARATION METHOD THEREOF, AND DISPLAY DEVICE

CROSS-REFERENCE TO RELATED APPLICATION

The present application claims the priority of Chinese Patent Application No. 201910813605.5 filed to the CNIPA on Aug. 30, 2019, the content of which is hereby incorporated by reference.

TECHNICAL FIELD

The present disclosure relates to but is not limited to the technical field of display, in particular to an organic light emitting display substrate and a preparation method thereof, and a display device.

BACKGROUND

Microdisplays have wide market applications, and are especially suitable for helmet-mounted displays, stereoscopic display mirrors, glasses type displays, etc. Microdisplays are at an intersection field of microelectronics and optoelectronics, involving a wide range of technologies, including optoelectronics, microelectronics, electronic informatics and optics, etc. The microdisplays pertain to a multi-disciplinary technical field involving physics, chemistry, materials science and electronics, etc. An OLED-on-silicon microdisplay using combination of Organic Light Emitting Diode (OLED) technology and Complementary Metal Oxide Semiconductor (CMOS) technology is a cross-integration product of optoelectronic industry and microelectronic industry. It can not only promote the development of a new generation of microdisplays, but also promote research and development of organic electrons on silicon and even molecular electrons on silicon.

Compared with digital micromirror devices (DMD) and liquid crystal on silicon (LCOS) microdisplays, OLED-on-silicon microdisplays have excellent display characteristics, including high brightness, rich colors, low driving voltage, fast response speed, low power consumption and so on, and have very excellent user experience. In addition, since an OLED is an all-solid device, it has a good anti-seismic performance and a wide working temperature range (−40° C. to 85° C.). Furthermore, since an OLED is a self-luminous device, it does not need a backlight source, its viewing angle range is large and its thickness is thin, beneficial for reducing a volume of a system, especially suitable for a near-eye display system.

When the OLED-on-silicon microdisplay is applied to augmented reality (AR), the most important display indexes are color gamut and brightness, because augmented reality products need to adjust the display brightness in different working environments and scenes to suit sensory experience of human eyes, especially in an outdoor scene directly facing the sun, in which a large increase in display brightness is required.

SUMMARY

The following is a summary of the subject matter described in detail herein. This summary is not intended to limit the protection scope of the claims.

A display substrate includes a plurality of pixel units arranged in a matrix, wherein the pixel units each include a plurality of sub-pixels, the sub-pixels each include a micro-cavity modulation layer and an emitting structure layer, the micro-cavity modulation layer is provided with a reflective electrode, the emitting structure layer includes a first electrode, an emitting layer and a semi-transparent and semi-reflective second electrode which are sequentially disposed on the micro-cavity modulation layer, and a distance between the second electrode and the reflective electrode is different in each sub-pixel.

In an exemplary embodiment, the sub-pixels each further include a silicon substrate and a driving circuit layer disposed on the silicon substrate, the micro-cavity modulation layer is disposed on the driving circuit layer, the driving circuit layer includes a driving transistor, and the reflective electrode is connected with both of a drain electrode of the driving transistor and the first electrode of the emitting structure layer.

In an exemplary embodiment, the pixel units each include a first sub-pixel.

A micro-cavity modulation layer of the first sub-pixel includes: a first reflective electrode disposed on the driving circuit layer, wherein the first reflective electrode is connected with the drain electrode of the driving circuit layer through a first via provided in the driving circuit layer; a first modulation layer covering the first reflective electrode, wherein the first modulation layer is provided with a second via exposing the first reflective electrode; a first connection block disposed in the second via, wherein the first connection block is connected with the first reflective electrode; a second modulation layer covering the first modulation layer and the first connection block, wherein the second modulation layer is provided with a third via exposing the first connection block; a second connection block disposed in the third via, wherein the second connection block is connected with the first connection block; and a third modulation layer covering the second modulation layer and the second connection block, wherein the third modulation layer is provided with a fourth via exposing the second connection block.

In an exemplary embodiment, the pixel units each include a second sub-pixel.

A micro-cavity modulation layer of the second sub-pixel includes: a first connection electrode disposed on the driving circuit layer, wherein the first connection electrode is connected with the drain electrode of the driving circuit layer through a first via provided in the driving circuit layer; a first modulation layer covering the first connection electrode, wherein the first modulation layer is provided with a second via exposing the first connection electrode; a first connection block disposed in the second via, wherein the first connection block is connected with the first connection electrode; a second reflective electrode disposed on the first modulation layer, wherein the second reflective electrode is connected with the first connection block; a second modulation layer covering the second reflective electrode, wherein the second modulation layer is provided with a third via exposing the second reflective electrode; a second connection block disposed in the third via, wherein the second connection block is connected with the second reflective electrode; and a third modulation layer covering the second modulation layer and the second connection block, wherein the third modulation layer is provided with a fourth via exposing the second connection block.

In an exemplary embodiment, the pixel units each include a third sub-pixel.

A micro-cavity modulation layer of the third sub-pixel includes: a first connection electrode disposed on the driving circuit layer, wherein the first connection electrode is connected with the drain electrode of the driving circuit layer through a first via provided in the driving circuit layer; a first modulation layer covering the first connection electrode, wherein the first modulation layer is provided with a second via exposing the first connection electrode; a first connection block disposed in the second via, wherein the first connection block is connected with the first connection electrode; a second modulation layer covering the first modulation layer and the first connection block, wherein the second modulation layer is provided with a third via exposing the first connection block; a second connection block disposed in the third via, wherein the second connection block is connected with the first connection block; a third reflective electrode disposed on the second modulation layer, wherein the third reflective electrode is connected with the second connection block; and a third modulation layer covering the third reflective electrode, wherein the third modulation layer is provided with a fourth via exposing the third reflective electrode.

In an exemplary embodiment, the display substrate may further include a third connection block disposed in the fourth via of the first sub-pixel, wherein the third connection block is connected with the second connection block of the first sub-pixel.

In an exemplary embodiment, the display substrate may further include a third connection block disposed in the fourth via of the second sub-pixel, and the third connection block is connected with the second connection block of the second sub-pixel.

In an exemplary embodiment, the display substrate may further include a third connection block disposed in the fourth via of the third sub-pixel, and the third connection block is connected with the third reflective electrode of the third sub-pixel.

In an exemplary embodiment, the emitting layer is an emitting layer that emits white light; and the sub-pixel further includes a color filter layer disposed on the emitting structure layer.

The present disclosure further provides a display device including any one or more of the aforementioned display substrates.

A preparation method for a display substrate panel includes: forming sequentially a micro-cavity modulation layer and an emitting structure layer in each of sub-pixels of a pixel unit, wherein the micro-cavity modulation layer has a reflective electrode formed therein, the emitting structure layer includes a first electrode, an emitting layer and a semi-transparent and semi-reflective second electrode which are sequentially formed on the micro-cavity modulation layer, and a distance between the second electrode and the reflection electrode is different in each sub-pixel.

In an exemplary embodiment, the preparation method further includes: forming a driving circuit layer on a silicon substrate, wherein the driving circuit layer includes a driving transistor, the micro-cavity modulation layer is formed on the driving circuit layer, the reflective electrode is connected with a drain electrode of the driving circuit layer, the emitting structure layer is formed on the micro-cavity modulation layer, and the first electrode of the emitting structure layer is connected with the reflective electrode.

In an exemplary embodiment, the pixel unit includes a first sub-pixel, a second sub-pixel and a third sub-pixel.

Forming the micro-cavity modulation layer includes: forming a first reflective electrode and two first connection electrodes on the driving circuit layer, wherein the first reflective electrode is formed in the first sub-pixel and is connected with a drain electrode of a driving transistor through a first via provided in the driving circuit layer, and the two first connection electrodes are respectively formed in the second sub-pixel and the third sub-pixel and are connected with drain electrodes of driving transistors respectively through first vias provided in the driving circuit layer; forming a first modulation layer covering the first reflective electrode and the two first connection electrodes, wherein each sub-pixel has a second via formed on the first modulation layer, a second via of the first sub-pixel exposes the first reflective electrode, and second vias of the second sub-pixel and the third sub-pixel expose the first connection electrodes; forming a first connection block in each sub-pixel's second via, wherein the first reflective electrode is connected with a first connection block of the first sub-pixel, and the two first connection electrodes are connected with a first connection block of the second sub-pixel and a first connection block of the third sub-pixel respectively; forming a second reflective electrode and a second connection electrode on the first modulation layer, wherein the second reflective electrode is formed in the second sub-pixel and connected with the first connection block of the second sub-pixel, and the second connection electrode is formed in the third sub-pixel and connected with the first connection block of the third sub-pixel; forming a second modulation layer covering the second reflective electrode and the second connection electrode, wherein each sub-pixel has a third via formed on the second modulation layer, a third via of the first sub-pixel exposes the first connection block of the first sub-pixel, a third via of the second sub-pixel exposes the second reflective electrode, and a third via of the third sub-pixel exposes the second connection electrode; forming a second connection block in each sub-pixel's third via, wherein the first connection block is connected with a second connection block of the first sub-pixel, the reflective electrode is connected with a second connection block of the second sub-pixel, and the second connection electrode is connected with a second connection block of the third sub-pixel; forming a third reflective electrode on the second modulation layer, wherein the third reflective electrode is formed in the third sub-pixel and connected with the second connection block of the third sub-pixel; and forming a third modulation layer covering the third reflective electrode, wherein each sub-pixel has a fourth via formed on the third modulation layer, a fourth via of the first sub-pixel and a fourth via of the second sub-pixel respectively expose the second connection block of the first sub-pixel and the second connection block of the second sub-pixel, and a fourth via of the third sub-pixel exposes the third reflective electrode.

In an exemplary embodiment, forming the micro-cavity modulation layer further includes any one or more of the following: forming a third connection block in the fourth via of the first sub-pixel, wherein the third connection block is connected with the second connection block of the first sub-pixel; forming a third connection block in the fourth via of the second sub-pixel, wherein the third connection block is connected with the second connection block of the second sub-pixel; and forming a third connection block in the fourth via of the third sub-pixel, wherein the third connection block is connected with the third reflective electrode of the third sub-pixel.

In an exemplary embodiment, forming the emitting structure layer includes: forming first electrodes on the third modulation layer, wherein the second connection block of the first sub-pixel is connected with a first electrode of the first sub-pixel through the fourth via of the first sub-pixel, the second connection block of the second sub-pixel is connected with a first electrode of the second sub-pixel through the fourth via of the second sub-pixel, and the third reflective electrode is connected with a first electrode of the third sub-pixel through the fourth via of the third sub-pixel; and forming sequentially the emitting layer and the second electrode.

In an exemplary embodiment, forming the emitting structure layer includes: forming first electrodes on the third modulation layer, wherein each sub-pixel has a first electrode connected with its third connection block; and forming sequentially the emitting layer and the second electrode.

In an exemplary embodiment, forming the first connection block in each sub-pixel's second via includes: filling a conductive material in each sub-pixel's second via through a filling processing to form the first connection block; and treating surfaces of the first modulation layer and the first connection block using a polishing process to form a flat surface on the first modulation layer and the first connection block.

In an exemplary embodiment, forming the second connection block in each sub-pixel's third via includes: filling a conductive material in each sub-pixel's third via through a filling processing to form the second connection block; and treating surfaces of the second modulation layer and the second connection block using a polishing process to form a flat surface on the second modulation layer and the second connection block.

In an exemplary embodiment, forming the third connection block in each sub-pixel's fourth via includes: filling a conductive material in each sub-pixel's fourth via through a filling processing to form the third connection block; and treating surfaces of the third modulation layer and the third connection block using a polishing process to form a flat surface on the third modulation layer and the third connection block.

In an exemplary embodiment, the emitting layer is an emitting layer that emits white light; and the preparation method further includes: forming a color filter layer on the emitting structure layer.

Other aspects will become apparent upon reading and understanding the drawings and detailed description.

BRIEF DESCRIPTION OF DRAWINGS

Accompanying drawings are used for providing a further understanding of technical solutions of the present disclosure and form a part of the specification. Together with embodiments of the present disclosure, the accompanying drawings are used for explaining technical solutions of the present disclosure and do not constitute a limitation on the technical solutions of the present disclosure. Shapes and sizes of the components in the drawings do not reflect real proportions, and are only for the purpose of schematically illustrating contents of the present disclosure.

DESCRIPTION OF THE REFERENCE SIGNS

10—Silicon Substrate;
20—Driving Circuit Layer;
21—Driving Transistor;
22—Drain Electrode;
30—Micro-Cavity Modulation Layer;
31—First Reflective Electrode;
32—Second Reflective Electrode;
32a—First Connection Electrode;
33—Third Reflective Electrode;
33a—First Connection Electrode;
33b—Second Connection Electrode;
34—First Modulation Layer;
35—First Connection Block;
36—Second Modulation Layer;
37—Second Connection Block;
38—Third Modulation Layer;
39—Third Connection Block;
40—Emitting Structure Layer;
41—First Electrode;

42—Pixel Define Layer;
43—Emitting Layer;
44—Second Electrode;
50—Color Filter Layer;
51—First Color Filter;
52—Second Color Filter;
53—Third Color Filter;
60—Lead Pad;
101—First Sub-Pixel;
102—Second Sub-Pixel;
103—Third Sub-Pixel;
431—First Emitting Sub-Layer;
432—First Charge Generating Layer;
433—Second Emitting Sub-Layer;
434—Second Charge Generating Layer;
435—Third Emitting Sub-Layer.

DETAILED DESCRIPTION

Embodiments herein may be implemented in a plurality of different forms. One of ordinary skill in the art can easily understand a fact that implementation modes and implementation contents can be changed into various forms without departing from the principle and scope of the present disclosure. Therefore, the present disclosure should not be construed to be limited only to what is described in the following embodiments. The embodiments in the present disclosure and the features in the embodiments may be combined with each other arbitrarily without conflicts.

Figure 1:
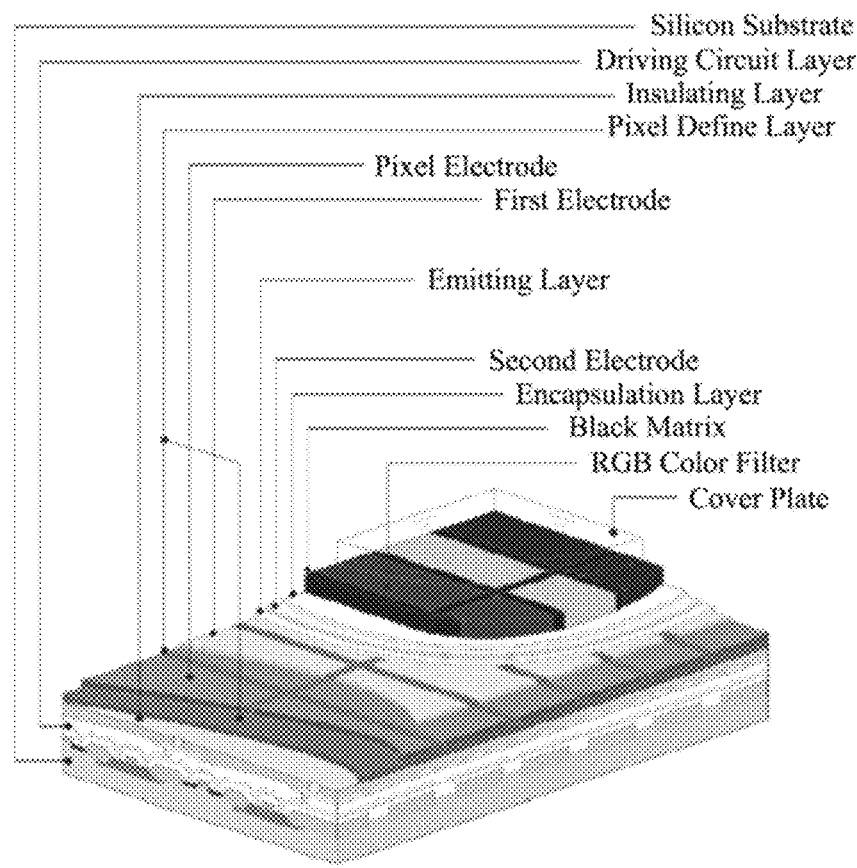
FIG. 1 is a schematic structural diagram of an existing OLED-on-silicon microdisplay.

FIG. 1 is a schematic structural diagram of an OLED-on-silicon microdisplay. Due to limitation of a fine metal mask (referred to as FMM for short), when an OLED is used as a microdisplay, full-color is realized by way of the combination of a white OLED and a color filter. As shown in FIG. 1, the OLED-on-silicon microdisplay includes a silicon substrate, a driving circuit layer, an emitting structure layer, an encapsulation layer, a color filter layer and a cover plate. The silicon substrate is also called an IC wafer. The driving circuit layer includes a pixel driving circuit, a pixel electrode, a Gate Driver on Array (referred to as GOA for short) and a corresponding IC driving circuit, etc. and the driving circuit layer is directly prepared on the silicon substrate. The emitting structure layer is disposed on the driving circuit layer and includes a first electrode, an emitting layer emitting white light and a second electrode. The encapsulation layer covers the emitting structure layer. The color filter layer is disposed on the encapsulation layer and includes a black matrix, a red (R) color filter (referred to as CF for short), a green (G) color filter and a blue (B) color filter. The cover plate covers the above structure. Although the combination of a white OLED and a color filter used in the OLED-on-silicon microdisplay can achieve high resolution in pixels per inch (PPI for short) and meet a requirement of a head-mounted display whose PPI is greater than 2000, this form limits an advantage of the high color gamut of the OLED itself. Under indexes of a brightness requirement 2000 nit and a white point coordinate (0.31, 0.31), the color gamut of the combination of a white OLED and a color filter is about 80%. In this case, due to the existence of the color filter, the color filter filters emitted light and only transmits the light in a corresponding color. When the white light emitted by the OLED passes through the color filter, most of the light energy will be consumed, and light out-coupling efficiency is low. This not only reduces the brightness of the emitted light, but also affects the color gamut of the emitted light. In order to improve the display brightness, it is needed to increase output of the OLED, thereby resulting in increased power consumption. Therefore, it is difficult for a traditional OLED-on-silicon microdisplay using the combination of a white OLED and a color filter to obtain higher color gamut and brightness.

The present disclosure provides an organic light emitting display substrate applied to an OLED-on-silicon microdisplay. According to the present disclosure, a display substrate includes a plurality of pixel units arranged in a matrix, wherein the pixel units each include a plurality of sub-pixels, the sub-pixels each include a micro-cavity modulation layer and an emitting structure layer, the micro-cavity modulation layer is provided with a reflective electrode, the emitting structure layer includes a first electrode, an emitting layer and a semi-transparent and semi-reflective second electrode which are sequentially disposed on the micro-cavity modulation layer, and a distance between the second electrode and the reflective electrode is different in each sub-pixel.

In the present disclosure, reflective electrodes are disposed and distance between a reflective electrode and second electrode is different in each sub-pixel, so that each sub-pixel forms a micro-cavity structure with a different cavity length, and emitting layers of different sub-pixels enhance emission of light rays near wavelengths corresponding to cavity lengths under a strong micro-cavity effect, thereby obtaining higher color gamut and brightness.

In the disclosure, the reflective electrode is disposed in the micro-cavity modulation layer, the micro-cavity length of the white OLED can be adjusted by designing a structural position of the reflective electrode in the micro-cavity modulation layer, transmission of the emitted light of emitting layer in each sub-pixel between the reflective electrode and the second electrode satisfies the strong micro-cavity effect, and emission of light near the wavelength corresponding to the cavity length is enhanced by using the strong micro-cavity effect. Thus, it is achieved that the light incident on the red color filter mainly includes red light, the light incident on the green color filter mainly includes green light, and the light incident on the blue color filter mainly includes blue light, thereby obtaining higher color gamut and brightness.

Figure 2:
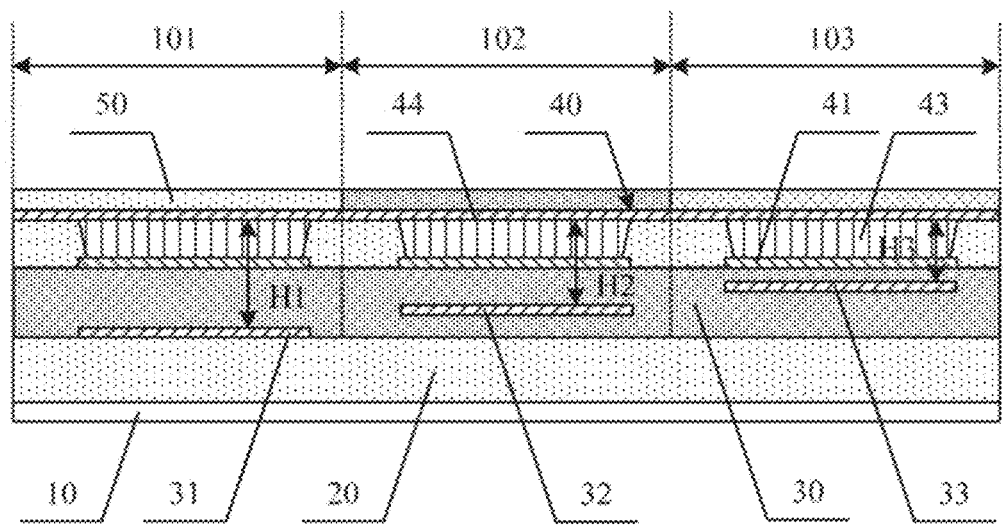
FIG. 2 is a schematic structural diagram of a display substrate according to the present disclosure.

FIG. 2 is a schematic structural diagram of a display substrate according to the present disclosure, and illustrates three sub-pixels of an organic light emitting display substrate with a top emission structure. The organic light emitting display substrate of the present disclosure includes a plurality of pixel units arranged in a matrix, each pixel unit includes a first sub-pixel 101, a second sub-pixel 102, and a third sub-pixel 103 which are arranged periodically, and the first sub-pixel 101, the second sub-pixel 102, and the third sub-pixel 103 are respectively configured to emit first color light, second color light, and third color light.

As shown in FIG. 2, on a plane perpendicular to the display substrate, each sub-pixel includes a driving circuit layer 20, a micro-cavity modulation layer 30, an emitting structure layer 40, and a color filter layer 50 which are stacked on a silicon substrate 10. The driving circuit layer 20 is disposed on the silicon substrate 10 and includes a driving transistor. The micro-cavity modulation layer 30 is disposed on the driving circuit layer 20. The micro-cavity modulation layer 30 in the first sub-pixel 101 includes a first reflective electrode 31, the micro-cavity modulation layer 30 in the second sub-pixel 102 includes a second reflective electrode 32, and the micro-cavity modulation layer 30 in the third sub-pixel 103 includes a third reflective electrode 33. The emitting structure layer 40 is disposed on the micro-cavity modulation layer 30, and includes a transparent first electrode 41, an emitting layer 43 emitting white light, and a semi-transparent and semi-reflective second electrode 44 sequentially disposed on the micro-cavity modulation layer 30. The color filter layer 50 is disposed on an encapsulation layer (not shown) covering the emitting structure layer 40. The color filter layer 50 in the first sub-pixel 101 includes a first color filter that allows only to transmit the first color light, the color filter layer 50 in the second sub-pixel 102 includes a second color filter that allows only to transmit the second color light, and the color filter layer 50 in the third sub-pixel 103 includes a third color filter that allows only to transmit the third color light.

In the present disclosure, the distance between the second electrode and the reflective electrode is different in each sub-pixel. Specifically, in the first sub-pixel 101, there is a first distance H1 between the first reflective electrode 31 of the micro-cavity modulation layer 30 and the second electrode 44 of the emitting structure layer 40; in the second sub-pixel 102, there is a second distance H2 between the second reflective electrode 32 of the micro-cavity modulation layer 30 and the second electrode 44 of the emitting structure layer 40; and in the third sub-pixel 103, there is a third distance H3 between the third reflective electrode 33 of the micro-cavity modulation layer 30 and the second electrode 44 of the emitting structure layer 40, and H1>H2>H3. In this way, the distances between the reflective electrodes and the second electrodes in the three sub-pixels are different, so that the micro-cavity structures formed by the three sub-pixels have different micro-cavity lengths. By utilizing the strong micro-cavity effect, the light near the wavelength corresponding to a resonant wavelength of the micro-cavity length in the light emitted by the emitting layer of each sub-pixel is strengthened and the spectrum is widened, while the light of other wavelengths not corresponding to the resonant wavelength is weakened and the spectrum is narrowed. As a result, the emitting structure layer in the first sub-pixel 101 mainly emits light of the first color, the emitting structure layer in the second sub-pixel 102 mainly emits light of the second color, and the emitting structure layer in the third sub-pixel 103 mainly emits light of the third color. Since in each sub-pixel, the color of the light emitted from the emitting structure layer is the same as the color of the light allowed to be transmitted from the color filter, light energy loss of the light transmitted from the color filter is reduced to the maximum extent, and the light out-coupling efficiency is improved, thus higher color gamut and brightness are obtained.

In this disclosure, a micro-cavity structure is formed between the reflective electrode and the second electrode in each sub-pixel, and the micro-cavity length refers to an optical length between two reflective surfaces. Due to the strong reflection effect of the reflective electrode, the light directly emitted from the emitting layer and the light reflected by the reflective electrode interfere with each other. This not only widens a spectrum of the light near the wavelength corresponding to the resonant wavelength of the cavity length, further improves the color purity and color gamut, but also strengthens light intensity of the light near the wavelength corresponding to the resonant wavelength of the cavity length, and further improves the brightness. The micro-cavity effect requires to satisfy $\delta=2j(\lambda/2)=2nd\cos\theta$, where $\delta$ is a micro-cavity phase difference, j is an integer, $\lambda$ is a wavelength of emitted light, n is an average refractive index of a medium in the micro-cavity, d is a micro-cavity length, and $\theta$ is a reflection angle. From the above formula of a micro-cavity optical path difference, it can be seen that the micro-cavity effect should try to be avoided for a light emitting structure emitting white light, because the micro-cavity length d is proportional to the wavelength $\lambda$ of the emitted light, and the wavelength range of white light is wide, existence of the micro-cavity effect in the light emitting structure will lead to uneven mixing of the emitted white light and a larger color cast. However, in the present disclosure, the micro-cavity effect causing the white light emitting structure to generate the color cast is utilized, and the micro-cavity effect is strengthened to the greatest extent, so that each of the light emitting structures of different sub-pixels in one pixel unit mainly emits light with one wavelength, and the wavelength is the same as that allowed to be transmitted from the color filter of the sub-pixel where the light emitting structure is located.

In an OLED preparation process, an FMM is used in vapor deposition to depose hole injection layers (HIL) with different thicknesses or to depose hole transporting layers (HTL) with different thicknesses, so as to realize the micro-cavity effect. However, due to the limitation of the FMM, the process cannot realize an OLED with more than 800 PPI, and thus the existing process approach is not suitable for an OLED-on-silicon microdisplay with high PPI. For this reason, the present disclosure provides a solution suitable for a structure in the combination of a white OLED and a color filter. By disposing of a micro-cavity modulation layer and a reflective electrode structure with an adjustable position in the micro-cavity modulation layer, not only the micro-cavity effect is achieved, but also different sub-pixels having different micro-cavity lengths is achieved.

In the present disclosure, in each sub-pixel, the reflective electrode is connected with both of a drain electrode of the driving transistor in the driving circuit layer and the first electrode of the emitting structure layer.

In an exemplary embodiment, a micro-cavity modulation layer of the first sub-pixel may include: a first reflective electrode disposed on the driving circuit layer, wherein the first reflective electrode is connected with the drain electrode of the driving circuit layer through a first via provided in the driving circuit layer; a first modulation layer covering the first reflective electrode, wherein the first modulation layer is provided with a second via exposing the first reflective electrode; a first connection block disposed in the second via, wherein the first connection block is connected with the first reflective electrode; a second modulation layer covering the first modulation layer and the first connection block, wherein the second modulation layer is provided with a third via exposing the first connection block; a second connection block disposed in the third via, wherein the second connection block is connected with the first connection block; and a third modulation layer covering the second modulation layer and the second connection block, wherein the third modulation layer is provided with a fourth via exposing the second connection block.

In an exemplary embodiment, a micro-cavity modulation layer of the second sub-pixel may include: a first connection electrode disposed on the driving circuit layer, wherein the first connection electrode is connected with a drain electrode of the driving circuit layer through a first via provided in the driving circuit layer; a first modulation layer covering the first connection electrode, wherein the first modulation layer is provided with a second via exposing the first connection electrode; a first connection block disposed in the second via, wherein the first connection block is connected with the first connection electrode; a second reflective electrode disposed on the first modulation layer, wherein the second reflective electrode is connected with the first connection block; a second modulation layer covering the second reflective electrode, wherein the second modulation layer is provided with a third via exposing the second reflective electrode; a second connection block disposed in the third via, wherein the second connection block is connected with the second reflective electrode; and a third modulation layer covering the second modulation layer and the second connection block, wherein the third modulation layer is provided with a fourth via exposing the second connection block.

In an exemplary embodiment, the micro-cavity modulation layer of the third sub-pixel may include: a first connection electrode disposed on the driving circuit layer, wherein the first connection electrode is connected with a drain electrode of the driving circuit layer through a first via provided in the driving circuit layer; a first modulation layer covering the first connection electrode, wherein the first modulation layer is disposed with a second via exposing the first connection electrode; a first connection block disposed in the second via, wherein the first connection block is connected with the first connection electrode; a second modulation layer covering the first modulation layer and the first connection block, wherein the second modulation layer is provided with a third via exposing the first connection block; a second connection block disposed in the third via, wherein the second connection block is connected with the first connection block; a third reflective electrode disposed on the second modulation layer, wherein the third reflective electrode is connected with the second connection block; and a third modulation layer covering the third reflective electrode, wherein the third modulation layer is provided with a fourth via exposing the third reflective electrode.

In an exemplary embodiment, the display substrate may further include a third connection block disposed in the fourth via of the first sub-pixel, and the third connection block is connected with the second connection block of the first sub-pixel.

In an exemplary embodiment, the display substrate may further include a third connection block disposed in the fourth via of the second sub-pixel, and the third connection block is connected with the second connection block of the second sub-pixel.

In an exemplary embodiment, the display substrate may further include a third connection block disposed in the fourth via of the third sub-pixel, and the third connection block is connected with the third reflective electrode of the third sub-pixel.

The technical solution of the present disclosure is described below through a preparation process of the display substrate of the present disclosure. The "patterning process" mentioned in the present disclosure includes deposition of a film layer, coating of photoresist, mask exposure, development, etching, stripping of photoresist, etc., and is a mature preparation process in the related technologies. The deposition may adopt known processes such as sputtering, evaporation, chemical vapor deposition, etc., and the coating may adopt known coating processes, and the etching may adopt known approaches, which are not limited here. In the description of the present disclosure, "thin film" refers to a layer of thin film manufactured from a certain material on a substrate through a depositing or coating process. If a patterning process or a photolithography process is not needed for the "thin film" during the whole manufacturing process, the "thin film" may also be referred to as a "layer". If a patterning process or a photolithography process is further needed for the "thin film" during the whole manufacturing process, it is referred to as "thin film" before the patterning process, and referred to as "layer" after the patterning process. The "layer" after the patterning process or photolithography process contains at least one "pattern".

(1) Forming a Silicon Substrate 10

A manufacturing process of forming the silicon substrate 10 may adopt an IC wafer manufacturing process.

(2) Forming a Driving Circuit Layer 20

Figure 3:
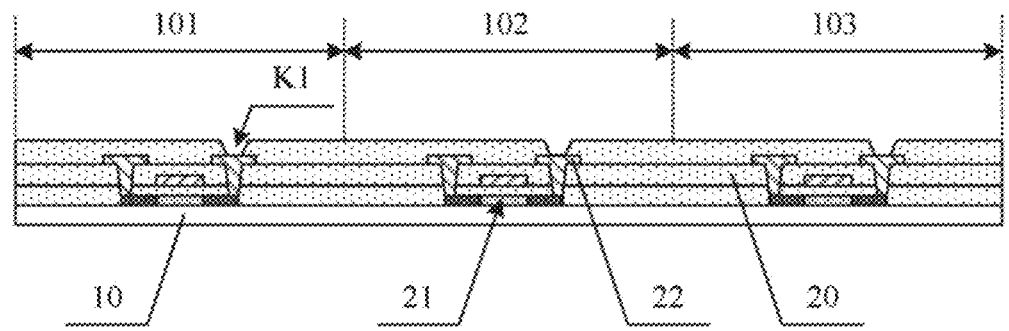
FIG. 3 is a schematic diagram of a display substrate obtained after a pattern of a driving circuit layer is formed in a preparation process according to the present disclosure.

The driving circuit layer 20 of the present disclosure may include a plurality of gate lines and a plurality of data lines, the plurality of gate lines and the plurality of data lines vertically intersect to define a plurality of sub-pixels arranged in a matrix, three sub-pixels are combined into one pixel unit, and each sub-pixel includes a plurality of thin film transistors (TFTs) including a drive transistor 21. In the present disclosure, one pixel unit may include a first sub-pixel 101, a second sub-pixel 102, and a third sub-pixel 103. In some possible implementations, the solution of the present disclosure is also suitable for a case where one pixel unit includes 4 sub-pixels. In the present disclosure, a preparation process of a pixel driving circuit may be used for forming the driving circuit layer 20. In some possible implementations, the preparation process may include preparing an active layer on the silicon substrate 10 of each sub-pixel through a patterning process, then forming a first insulating layer covering the active layer, forming a gate line and a gate electrode on the first insulating layer of each sub-pixel, then forming a second insulating layer covering the gate line and the gate electrode, forming a data line, a source electrode and a drain electrode on the second insulating layer of each sub-pixel, forming a third insulating layer covering the data line, the source electrode and the drain electrode, and providing a first via K1 exposing the drain electrode 22 of the driving transistor 21 in the third insulating layer of each sub-pixel. The above content may be understood with reference to FIG. 3. The gate electrode, the active layer, the source electrode and the drain electrode form a thin film transistor, and the thin film transistor may be a bottom gate structure or a top gate structure, which is not limited here.

Figure 4:
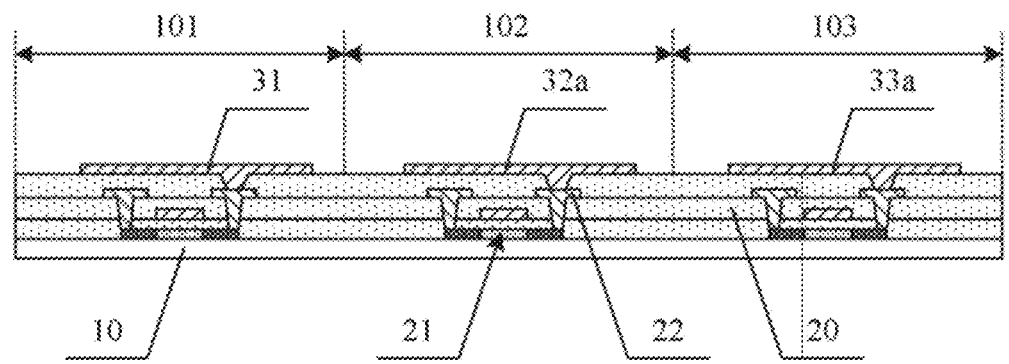
FIG. 4 is a schematic diagram of a display substrate obtained after patterns of a first reflective electrode and a connection electrode are formed in a preparation process according to the present disclosure.

(3) Forming Patterns of a First Reflective Electrode and a First Connection Electrode In an exemplary embodiment, the forming patterns of a first reflective electrode and a first connection electrode may include: depositing a first metal film on the substrate with the aforementioned formed pattern, and patterning the first metal film through a patterning process to form patterns of a first reflective electrode 31, a first connection electrode 32a, and a first connection electrode 33a on the driving circuit layer 20. The first reflective electrode 31 is formed on the first sub-pixel 101, and is connected with a drain electrode 22 of a driving transistor 21 of the first sub-pixel through a first via K1 of the first sub-pixel. The first connection electrode 32a is formed in the second sub-pixel 102, and is connected with a drain electrode 22 of a driving transistor 21 of the second sub-pixel through a first via K1 of the second sub-pixel. The first connection electrode 33a is formed in the third sub-pixel 103, and is connected with a drain electrode 22 of a driving transistor 21 of the third sub-pixel through a first via K1 of the third sub-pixel. The above content may be understood with reference to FIG. 4.

(4) Forming a Pattern of a First Modulation Layer

Figure 5:
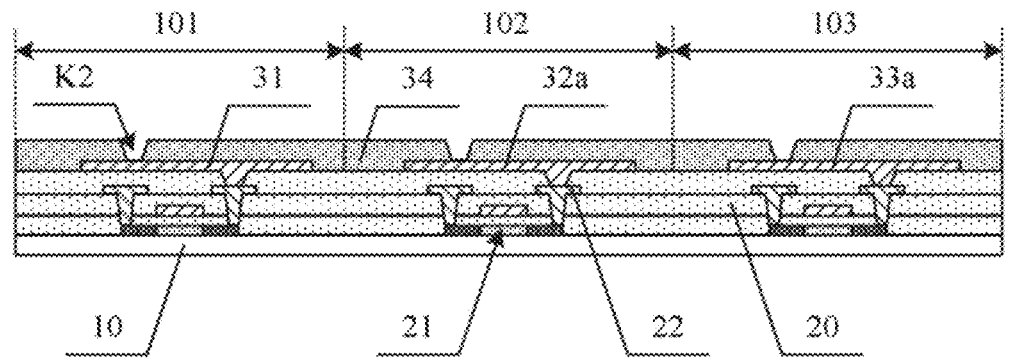
FIG. 5 is a schematic diagram of a display substrate obtained after a pattern of a first modulation layer is formed in a preparation process according to the present disclosure.

In an exemplary embodiment, the forming a pattern of a first modulation layer may include: depositing a first modulation film on the substrate with the aforementioned formed pattern, and patterning the first modulation film through a patterning process to form a pattern of a first modulation layer 34 covering the first reflective electrode 31, the first connection electrode 32a, and the first connection electrode 33a. Each sub-pixel has a second via K2 formed on the first modulation layer 34, a second via K2 of the first sub-pixel 101 exposes the first reflective electrode 31, a second via K2 of the second sub-pixel 102 exposes the first connection electrode 32a, and a second via K2 of the third sub-pixel 103 exposes the first connection electrode 33a. The above content may be understood with reference to FIG. 5.

(5) Forming a Pattern of a First Connection Block

Figure 6:
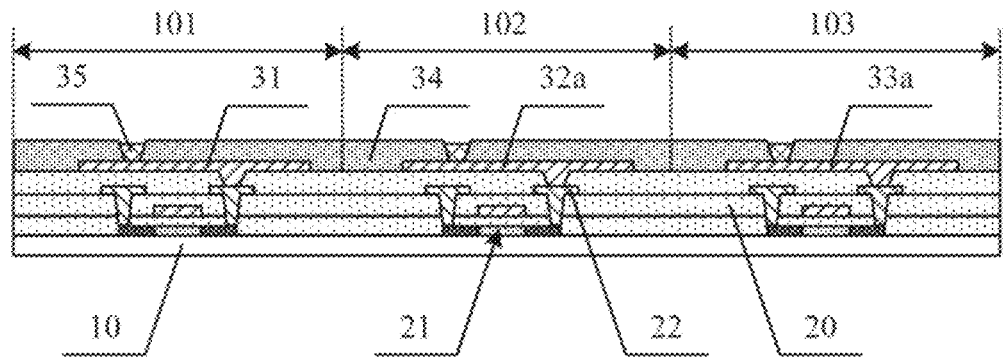
FIG. 6 is a schematic diagram of a display substrate obtained after a pattern of a first connection block is formed in a preparation process according to the present disclosure.

In an exemplary embodiment, the forming a pattern of a first connection block may include: filling a conductive material in each sub-pixel's second via K2 through a filling processing to form a pattern of a first connection block 35. A first connection block 35 of the first sub-pixel 101 is connected with the first reflective electrode 31 through a second via K2, a first connection block 35 of the second sub-pixel 102 is connected with the first connection electrode 32a through a second via K2, and a first connection block 35 of the third sub-pixel 103 is connected with the first connection electrode 33a through a second via K2. The above content may be understood with reference to FIG. 6.

(6) Performing a Polishing Treatment

Figure 7:
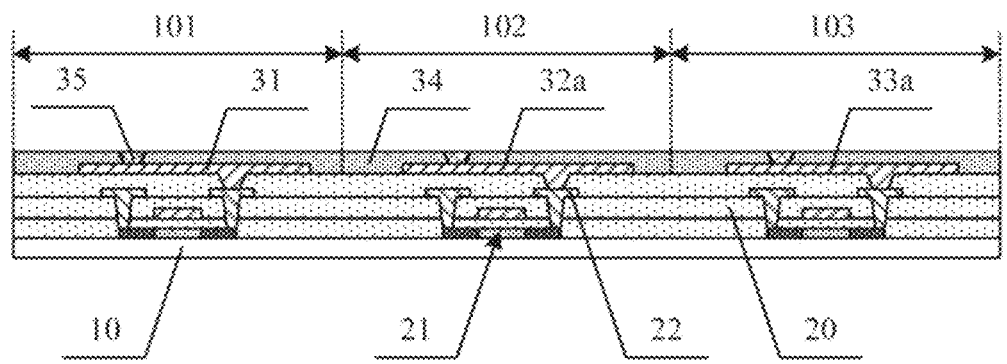
FIG. 7 is a schematic diagram of a display substrate obtained after polishing treatment is performed in a preparation process according to the present disclosure.

In an exemplary embodiment, performing the polishing treatment may include: etching and rubbing surfaces of the first modulation layer 34 and first connection blocks 35 using a polishing process to remove part of the thickness of the first modulation layer 34 and the first connection blocks 35 so that a nearly flat surface is formed on the first modulation layer 34 and the first connection blocks 35. The above content may be understood with reference to FIG. 7.

Figure 8:
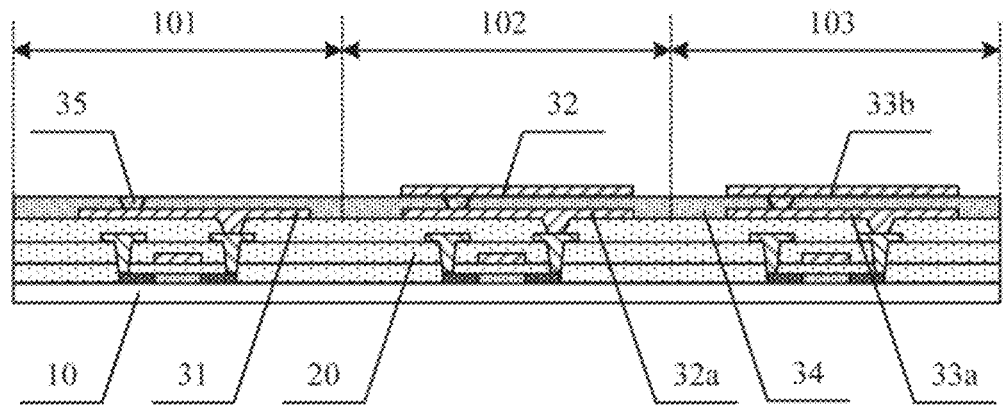
FIG. 8 is a schematic diagram of a display substrate obtained after patterns of a second reflective electrode and a connection electrode are formed in a preparation process according to the present disclosure.

(7) Forming Patterns of a Second Reflective Electrode and a Second Connection Electrode In an exemplary embodiment, the forming patterns of a second reflective electrode and a second connection electrode may include: depositing a second metal film on the substrate with the aforementioned formed pattern, and patterning the second metal film through a patterning process to form patterns of a second reflective electrode 32 and a second connection electrode 33b on the first modulation layer 34. The second reflective electrode 32 is formed on the second sub-pixel 102 and connected with the first connection block 35 of the second sub-pixel. The second connection electrode 33b is formed in the third sub-pixel 103 and connected with the first connection block 35 of the third sub-pixel. The above content may be understood with reference to FIG. 8.

(8) Forming a Pattern of a Second Modulation Layer

Figure 9:
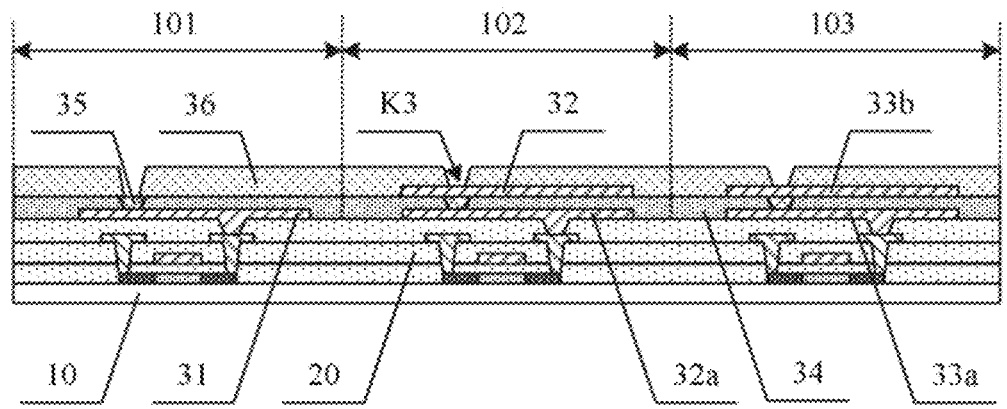
FIG. 9 is a schematic diagram of a display substrate obtained after a pattern of a second modulation layer is formed in a preparation process according to the present disclosure.

In an exemplary embodiment, the forming a pattern of a second modulation layer may include: depositing a second modulation film on the substrate with the aforementioned formed pattern, and patterning the second modulation film through a patterning process to form a pattern of a second modulation layer 36 covering the second reflective electrode 32 and the second connection electrode 33b. Each sub-pixel has a third via K3 formed on the second modulation layer 36, a third via K3 of the first sub-pixel 101 exposes the first connection block 35 of the first sub-pixel, a third via K3 of the second sub-pixel 102 exposes the second reflective electrode 32, and a third via K3 of the third sub-pixel 103 exposes the second connection electrode 33b. The above content may be understood with reference to FIG. 9.

Figure 10:
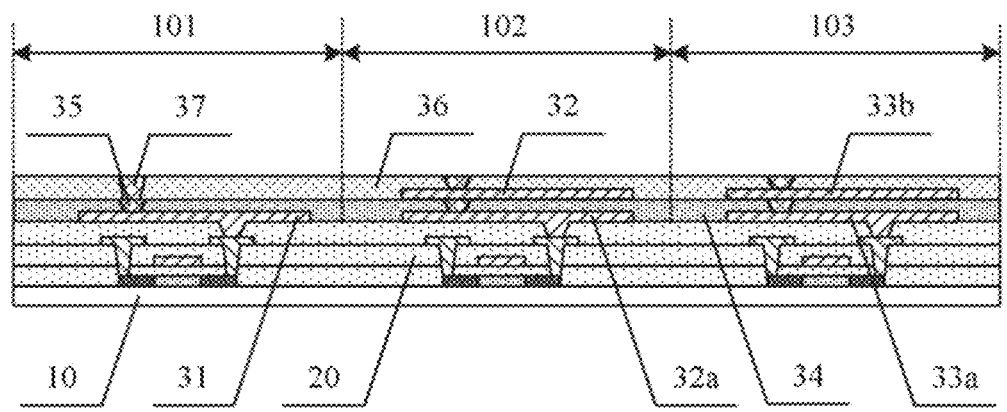
FIG. 10 is a schematic diagram of a display substrate obtained after a second connection block is formed and polishing treatment is performed in a preparation process according to the present disclosure.

(9) Forming a Pattern of Second Connection Block and Performing Polishing Treatment In an exemplary embodiment, the forming a pattern of second connection block and performing polishing treatment may include: filling a conductive material in each sub-pixel's third via K3 through a filling processing to form a pattern of second connection block 37. A second connection block 37 of the first sub-pixel 101 is connected with the first connection block 35 through a third via K3, a second connection block 37 of the second sub-pixel 102 is connected with the second reflective electrode 32 through a third via K3, and a second connection block 37 of the third sub-pixel 103 is connected with the second connection electrode 33b through a third via K3. Subsequently, the forming a pattern of second connection block and performing polishing treatment may further include: etching and rubbing surfaces of the second modulation layer 36 and second connection blocks 37 using a polishing process to remove part of the thickness of the second modulation layer 36 and the second connection blocks 37 so that a nearly flat surface is formed on the second modulation layer 36 and the second connection blocks 37. The above content may be understood with reference to FIG. 10.

(10) Forming a Pattern of a Third Reflective Electrode

Figure 11:
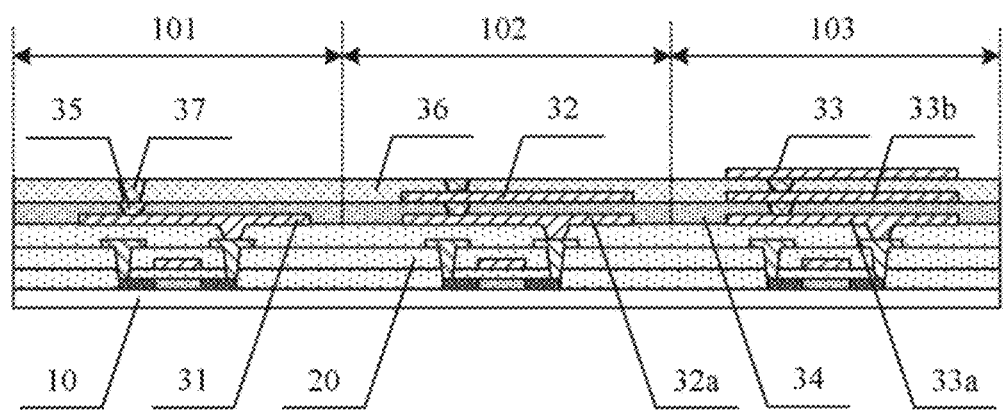
FIG. 11 is a schematic diagram of a display substrate obtained after a pattern of a third reflective electrode is formed in a preparation process according to the present disclosure.

In an exemplary embodiment, the forming a pattern of a third reflective electrode may include: depositing a third metal film on the substrate with the aforementioned formed pattern, and patterning the third metal film through a patterning process to form a third reflective electrode 33 on the second modulation layer 36. The third reflective electrode 33 is formed on the third sub-pixel 103 and connected with the second connection block 37 of the third sub-pixel. The above content may be understood with reference to FIG. 11.

(11) Forming a Pattern of a Third Modulation Layer

Figure 12:
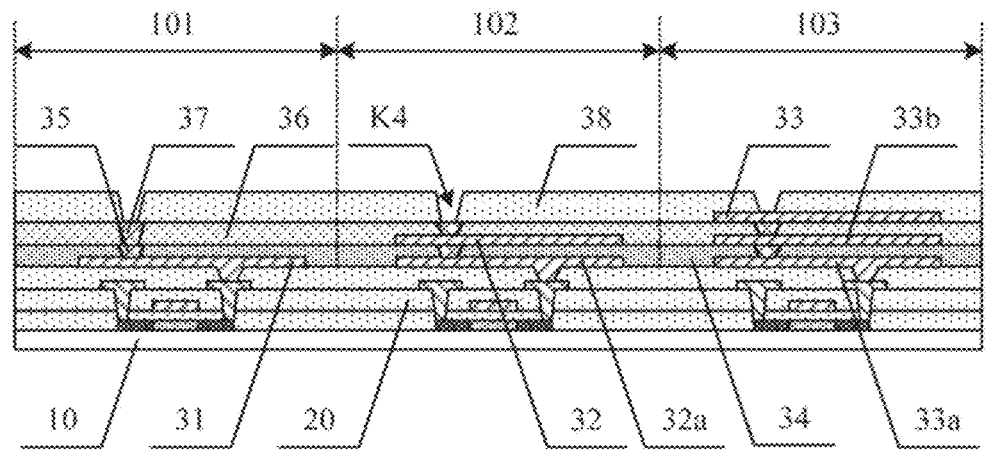
FIG. 12 is a schematic diagram of a display substrate obtained after a pattern of a third modulation layer is formed in a preparation process according to the present disclosure.

In an exemplary embodiment, the forming a pattern of a third modulation layer may include: depositing a third modulation film on the substrate with the aforementioned formed pattern, and patterning the third modulation film through a patterning process to form a pattern of a third modulation layer 38 covering the third reflective electrode 33. Each sub-pixel has a fourth via K4 formed on the third modulation layer 38, a fourth via K4 of the first sub-pixel 101 exposes the second connection block 37 of the first sub-pixel, a fourth via K4 of the second sub-pixel 102 exposes the second connection block 37 of the second sub-pixel, and a fourth via K4 of the third sub-pixel 103 exposes the third reflective electrode 33. The above content may be understood with reference to FIG. 12.

Figure 13:
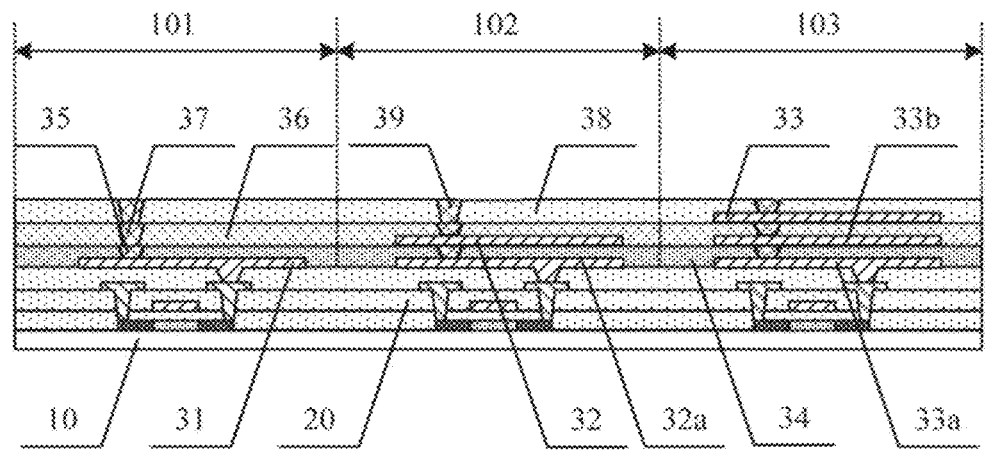
FIG. 13 is a schematic diagram of a display substrate obtained after a third connection block is formed and polishing treatment is performed in a preparation process according to the present disclosure.

(12) Forming a Pattern of a Third Connection Block and Performing Polishing Treatment In an exemplary embodiment, the forming a pattern of a third connection block and performing polishing treatment may include: filling a conductive material in each sub-pixel's fourth via K4 through a filling processing to form a pattern of a third connection block 39. A third connection block 39 of the first sub-pixel 101 is connected with the second connection block 37 of the first sub-pixel through a fourth via K4, a third connection block 39 of the second sub-pixel 102 is connected with the second connection block 37 of the second sub-pixel through a fourth via K4, and a third connection block 39 of the third sub-pixel 103 is connected with the third reflective electrode 33 through the fourth via K4. Subsequently, the forming a pattern of a third connection block and performing polishing treatment may further include: etching and rubbing surfaces of the third modulation layer 38 and third connection blocks 39 using a polishing process to remove part of the thickness of the third modulation layer 38 and the third connection blocks 39, so that a nearly flat surface is formed on the third modulation layer 38 and the third connection blocks 39. The above content may be understood with reference to FIG. 13.

In this way, the micro-cavity modulation layer 30 of the present disclosure is formed by acts (3) to (12). In the formed micro-cavity modulation layer 30, the first reflective electrode 31 of the first sub-pixel 101, the second reflective electrode 32 of the second sub-pixel 102, and the third reflective electrode 33 of the third sub-pixel 103 are respectively disposed in different structural layers, and distance between the third reflective electrode 33 and the silicon substrate 10 is greater than distance between the second reflective electrode 32 and the silicon substrate 10, and distance between the second reflective electrode 32 and the silicon substrate 10 is greater than distance between the first reflective electrode 31 and the silicon substrate 10.

(13) Forming a Pattern of a First Electrode

Figure 14:
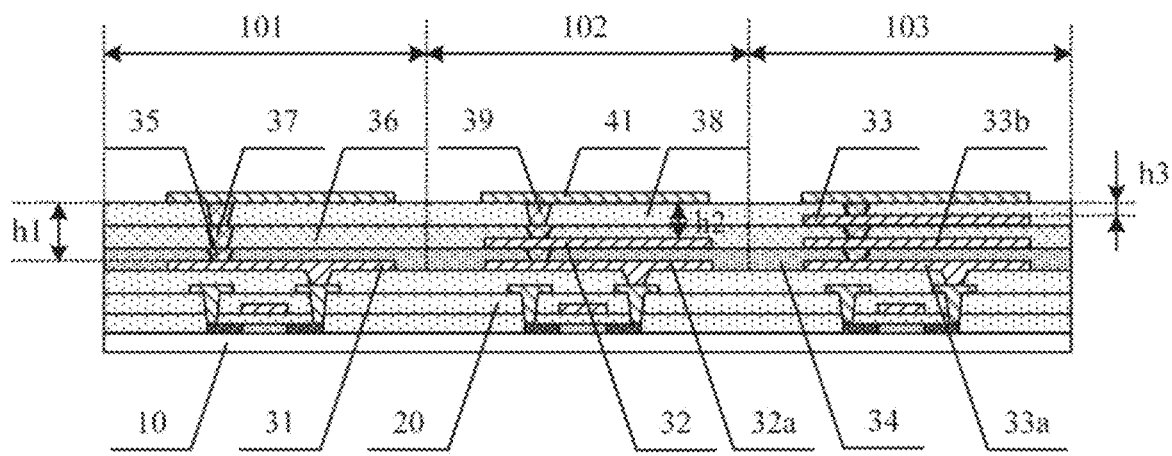
FIG. 14 is a schematic diagram of a display substrate obtained after a pattern of a first electrode is formed in a preparation process according to the present disclosure.

In an exemplary embodiment, the forming a pattern of a first electrode may include: depositing a transparent conductive film on the substrate with the aforementioned formed pattern, and patterning the transparent conductive film through a patterning process to form a pattern of a first electrode 41 on the third modulation layer 38 of each sub-pixel. Each sub-pixel has a first electrode 41 connected with its third connection block 39. The above content may be understood with reference to FIG. 14. A first electrode 41 formed in the first sub-pixel 101 is connected with the third connection block 39 of the first sub-pixel, a first electrode 41 formed in the second sub-pixel 102 is connected with the third connection block 39 of the second sub-pixel, and a first electrode 41 formed in the third sub-pixel 103 is connected with the third connection block 39 of the third sub-pixel. In an exemplary embodiment, the first electrode is a transparent anode.

In the first sub-pixel 101, since the first electrode 41 is connected with the first reflective electrode 31 through the third connection block 39, the second connection block 37, and the first connection block 35 of the first sub-pixel, and the first reflective electrode 31 is connected with the drain electrode 22 of the driving transistor 21 of the first sub-pixel, a connection of the first electrode 41 with the drain electrode 22 of the driving transistor 21 is realized. In the second sub-pixel 102, since the first electrode 41 is connected with the second reflective electrode 32 through the third connection block 39 and the second connection block 37 of the second sub-pixel, and the second reflective electrode 32 is connected with the drain electrode 22 of the driving transistor 21 of the second sub-pixel through the first connection block 35, a connection of the first electrode 41 with the drain electrode 22 of the driving transistor 21 is realized. In the third sub-pixel 103, since the first electrode 41 is connected with the third reflective electrode 33 through the third connection block 39 of the sub-pixel, and the third reflective electrode 33 is connected with the drain electrode 22 of the driving transistor 21 of the third sub-pixel through the second connection block 37 and the first connection block 35, a connection of the first electrode 41 with the drain electrode 22 of the driving transistor 21 is realized.

Since the first electrodes of the three sub-pixels are disposed on the same layer and formed through the same patterning process, the distances between the first electrodes of the three sub-pixels and the silicon substrate are the same, while the distances between the reflective electrodes of the three sub-pixels and the silicon substrate are different, so the distances between the first electrodes and the reflective electrodes of the three sub-pixels are different. In the first sub-pixel 101, there is a first distance h1 between the first electrode 41 and the first reflective electrode 31. In the second sub-pixel 102, there is a second distance h2 between the first electrode 41 and the second reflective electrode 32. In the third sub-pixel 103, there is a third distance h3 between the first electrode 41 and the third reflective electrode 33, and h1>h2>h3

(14) Forming Patterns of an Emitting Layer and a Second Electrode

Figure 15:
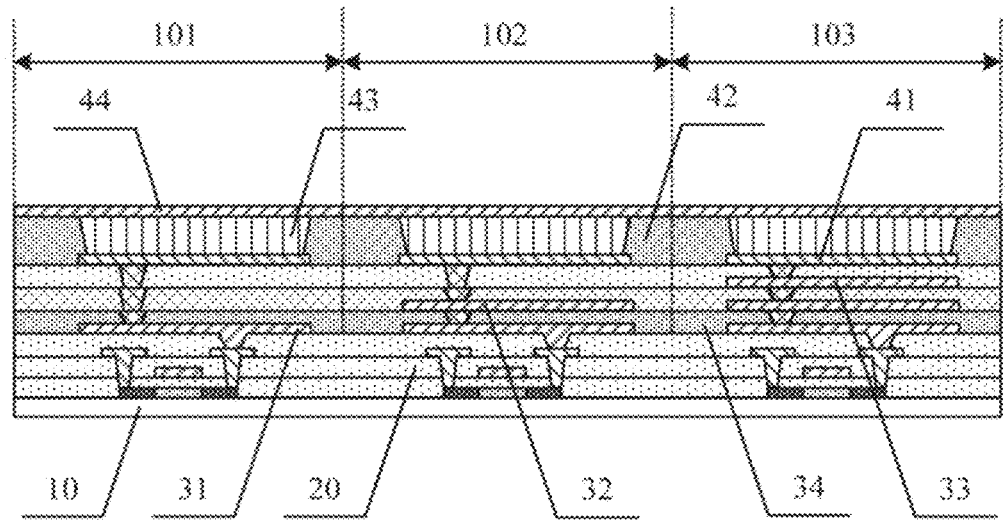
FIG. 15 is a schematic diagram of a display substrate obtained after patterns of an emitting layer and a second electrode are formed in a preparation process according to the present disclosure.

In an exemplary embodiment, the forming patterns of an emitting layer and a second electrode may include: coating a pixel define film on a substrate with the aforementioned formed pattern, and forming a pattern of a pixel define layer (PDL) 42 after masking, exposure, and development. The pixel define layer 42 defines an opening area at each sub-pixel, and the opening area exposes the first electrode 41. Subsequently, the forming patterns of an emitting layer and a second electrode may further include: forming an emitting layer 43 in the opening area of each sub-pixel, and a structure of the emitting layer 43 of each sub-pixel is the same. Finally, the forming patterns of an emitting layer and a second electrode may further include: depositing a semi-transparent and semi-reflective metal film on the substrate with the aforementioned formed pattern to form a second electrode 44. The above content may be understood with reference to FIG. 15. Since the pixel define layer, the emitting layer and the second electrode of each sub-pixel are all formed by the same process and have the same structure, a distance between the first electrode and the second electrode of each sub-pixel is the same, while distances between the first electrodes and the reflective electrodes of the three sub-pixels are different, thus the distances between the second electrodes and the reflective electrodes of the three sub-pixels are different, so that the micro-cavity structures of the three sub-pixels have different cavity lengths. In an exemplary embodiment, the second electrode is a semi-transparent and semi-reflective cathode.

Figure 16:
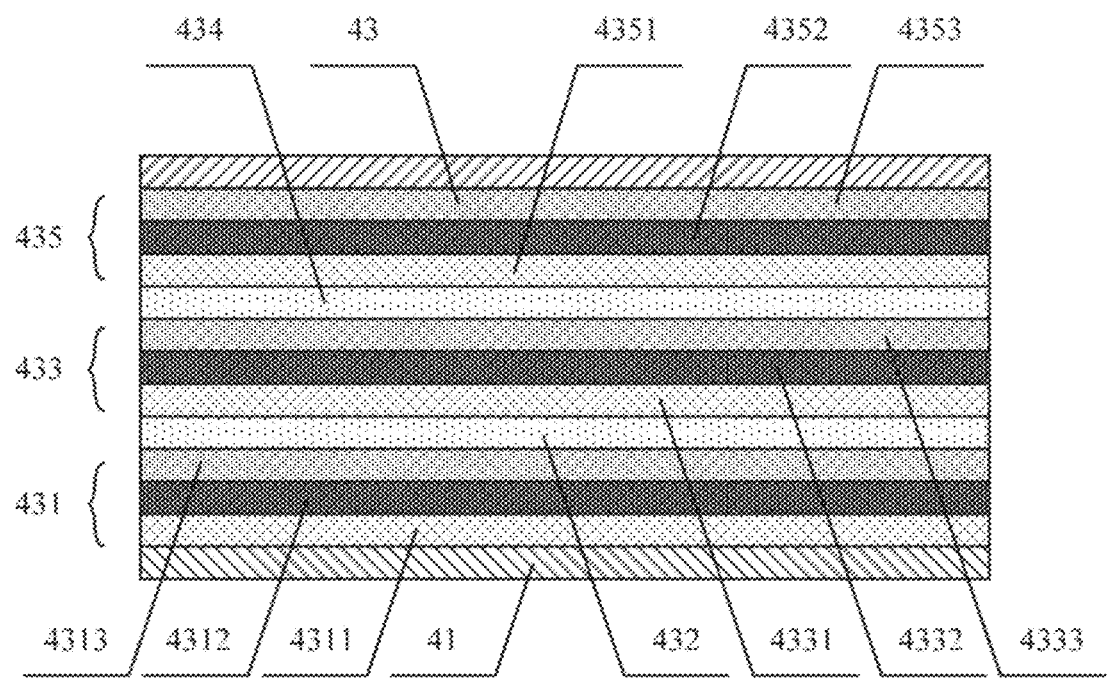
FIG. 16 is a schematic structural diagram of an emitting layer according to the present disclosure.

FIG. 16 is a schematic structural diagram of an emitting layer according to the present disclosure. As shown in FIG. 16, in an exemplary embodiment, the emitting layer may include a first emitting sub-layer 431, a first charge generating layer 432, a second emitting sub-layer 433, a second charge generating layer 434, and a third emitting sub-layer 435 sequentially stacked between the first electrode 41 and the second electrode 44. The first emitting sub-layer 431 is configured to emit light of a first color, and may include a first hole transporting layer (HTL) 4311, a first emitting material layer (EML) 4312, and a first electron transporting layer (ETL) 4313 which are sequentially stacked. The second emitting sub-layer 433 is configured to emit light of a second color, and may include a second hole transporting layer 4331, a second emitting material layer 4332, and a second electron transporting layer 4333 which are sequentially stacked. The second emitting sub-layer 435 is configured to emit light of a third color, and may include a third hole transporting layer 4351, a third emitting material layer 4352, and a third electron transporting layer 4353 which are sequentially stacked. The first charge generating layer 432 is disposed between the first emitting sub-layer 431 and the second emitting sub-layer 433, and is configured to connect the two emitting sub-layers in series to realize the transfer of carriers. The second charge generating layer 434 is disposed between the second emitting sub-layer 433 and the third emitting sub-layer 435, and is configured to connect the two light emitting sub-layers in series to realize the transfer of carriers. Since the emitting layer includes a first emitting material layer emitting light of the first color, a second emitting material layer emitting light of the second color, and a third emitting material layer emitting light of the third color, the light finally emitted by the emitting layer is mixed light. In some possible implementations, it may be provided that the first emitting material layer is a red light material layer emitting red light, the second emitting material layer is a green light material layer emitting green light, and the third emitting material layer is a blue light material layer emitting blue light, so that the emitting layer finally emits white light.

The emitting layer shown in FIG. 16 is only an example structure, and the structure of the emitting layer may be designed according to actual needs, and it is not limited in the present disclosure. In one exemplary embodiment, in each emitting sub-layer, in order to improve the efficiency of injecting electrons and holes into the emitting material layer, a hole injection layer (HIL) and an electron injection layer (EIL) may be provided. In another exemplary disclosure, in order to simplify the structure of the emitting layer, the first electron transporting layer 4313, the first charge generating layer 432, and the second hole transporting layer 4331 may be canceled, that is, the second emitting material layer 4332 may be disposed directly on the first emitting material layer 4312.

(15) Forming Patterns of an Encapsulation Layer and a Color Filter Layer

Figure 17:
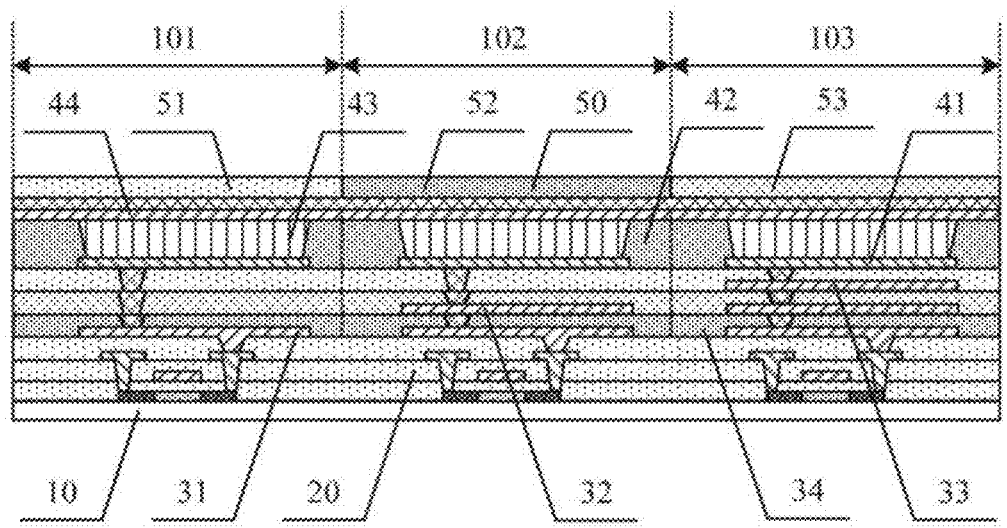
FIG. 17 is a schematic diagram of a display substrate obtained after patterns of an encapsulation layer and a color filter layer are formed according to the present disclosure.

In an exemplary embodiment, the forming patterns of an encapsulation layer and a color filter layer may include: forming an encapsulation layer sealing the emitting structure layer by depositing an inorganic material and/or coating an organic material on the substrate with the aforementioned formed pattern. Subsequently, the forming patterns of an encapsulation layer and a color filter layer may further include: forming a pattern of a color filter layer 50 on the encapsulation layer by coating a color resin film, masking, exposing, and developing. The color filter layer 50 includes a first color filter 51 located in the first sub-pixel 101, a second color filter 52 located in the second sub-pixel 102, and a third color filter 53 located in the third sub-pixel 103. The above content may be understood with reference to FIG. 17. The first color filter 51 only allows to transmit light of the first color and filters light of other colors. The second color filter 52 only allows to transmit light of the second color and filters light of other colors. The third color filter 53 only allows to transmit light of the third color and filters light of other colors. In some possible implementations, forming the pattern of the color filter layer may include forming a corresponding black matrix or the like structure.

As shown in FIGS. 3 to 17, a display substrate prepared by the preparation process of the present disclosure includes: a silicon substrate 10, a driving circuit layer 20, a micro-cavity modulation layer 30, an emitting structure layer 40, an encapsulation layer, and a color filter layer 50.

The driving circuit layer 20 is disposed on the silicon substrate 10, the driving circuit layer 20 of each sub-pixel includes a driving transistor 21, and a first via K1 exposing a drain electrode 22 of the driving transistor 21 is provided in the driving circuit layer 20.

The micro-cavity modulation layer 30 is disposed on the driving circuit layer 20, and the micro-cavity modulation layer 30 includes: a first reflective electrode 31, a first connection electrode 32a, and a first connection electrode 33a disposed on the driving circuit layer 20. The first reflective electrode 31 is disposed on the first sub-pixel 101, the first connection electrode 32a is disposed on the second sub-pixel, the first connection electrode 33a is disposed on the third sub-pixel 103, the first reflective electrode 31, the first connection electrode 32a, and the first connection electrode 33a are respectively connected with drain electrodes 22 of driving transistors 21 of the three sub-pixels through first vias K1 of the three sub-pixels.

The micro-cavity modulation layer 30 further includes: a first modulation layer 34 covering the first reflective electrode 31, the first connection electrode 32a and the first connection electrode 33a. Each sub-pixel has a second via K2 disposed on the first modulation layer 34, a second via K2 of the first sub-pixel 101 exposes the first reflective electrode 31, a second via K2 of the second sub-pixel 102 exposes the first connection electrode 32a of the second sub-pixel, and a second via K2 of the third sub-pixel 103 exposes the first connection electrode 33a of the third sub-pixel.

The micro-cavity modulation layer 30 further includes: a first connection block 35 disposed in each sub-pixel's second via K2. A first connection block 35 of the first sub-pixel 101 is connected with the first reflective electrode 31, a first connection block 35 of the second sub-pixel is connected with the first connection electrode 32a of the second sub-pixel, and a first connection block 35 of the third sub-pixel is connected with the first connection electrode 33a of the third sub-pixel.

The micro-cavity modulation layer 30 further includes: a second reflective electrode 32 and a second connection electrode 33b disposed on the first modulation layer 34. The second reflective electrode 32 is disposed on the second sub-pixel 102 and connected with the first connection block 35 of the second sub-pixel, the second connection electrode 33b is disposed on the third sub-pixel 103 and connected with the first connection block 35 of the third sub-pixel.

The micro-cavity modulation layer 30 further includes: a second modulation layer 36 covering the second reflective electrode 32 and the second connection electrode 33b. Each sub-pixel has a third via K3 disposed on the second modulation layer 36, a third via K3 of the first sub-pixel 101 exposes the first connection block 35 of the first sub-pixel, a third via K3 of the second sub-pixel 102 exposes the second reflective electrode 32, and a third via K3 of the third sub-pixel 103 exposes the second connection electrode 33b.

The micro-cavity modulation layer 30 further includes: a second connection block 37 disposed in each sub-pixel's third via K3. A second connection block 37 of the first sub-pixel 101 is connected with the first connection block 35, the second connection block 37 of the second sub-pixel 102 is connected with the second reflective electrode 32, and the second connection block 37 of the third sub-pixel 103 is connected with the second connection electrode 33b.

The micro-cavity modulation layer 30 further includes: a third reflective electrode 33 disposed on the second modulation layer 36. The third reflective electrode 33 is disposed on the third sub-pixel 103 and connected with the second connection block 37 of the third sub-pixel.

The micro-cavity modulation layer 30 further includes: a third modulation layer 38 covering the third reflective electrode 33. Each sub-pixel has a fourth via K4 disposed on the third modulation layer 38, a fourth via K4 of the first sub-pixel 101 exposes the second connection block 37 of the first sub-pixel, a fourth via K4 of the second sub-pixel 102 exposes the second connection block 37 of the second sub-pixel, and a fourth via K4 of the third sub-pixel 103 exposes the third reflective electrode 33.

The micro-cavity modulation layer 30 further includes: a third connection block 39 disposed in each sub-pixel's fourth via K4. A third connection block 39 of the first sub-pixel 101 is connected with the second connection block 37 of the first sub-pixel, a third connection block 39 of the second sub-pixel 102 is connected with the second connection block 37 of the second sub-pixel, a third connection block 39 of the third sub-pixel 103 is connected with the third reflective electrode 33.

The micro-cavity emitting structure layer 40 is disposed on the modulation layer 30. The emitting structure layer 40 includes: a transparent first electrode 41 disposed on the third modulation layer 38, wherein each sub-pixel has a first electrode 41 connected with its third connection block 39; a pixel define layer 42 disposed on the third modulation layer 38, wherein the pixel define layer 42 defines an opening area in each sub-pixel, and the opening area exposes the first electrode 41; an emitting layer 43 that emits white light and is disposed in the opening area; and a semi-transparent and semi-reflective second electrode 44 disposed on the emitting layer 43.

The encapsulation layer is disposed on the emitting structure layer 40.

The color filter layer 50 is disposed on the encapsulation layer. The color filter layer 50 includes: a first color filter 51 disposed on the first sub-pixel 101, a second color filter 52 disposed in the second sub-pixel 102, and a third color filter 53 disposed in the third sub-pixel 103. The first color filter 51 allows only to transmit light of the first color, the second color filter 52 allows only to transmit light of the second color, and the third color filter 53 allows only to transmit light of the third color.

According to the present disclosure, a micro-cavity modulation layer including a reflective electrode is disposed to form a micro-cavity structure between a reflective electrode for reflecting light and a second electrode for semi-transmitting and semi-reflecting the light in each sub-pixel, so that the light directly emitted from the emitting layer and the light reflected by the reflective electrode interfere with each other to improve the color gamut and brightness of emitted light. Since the reflective electrodes in the three sub-pixels are respectively disposed in different structural layers, and the distances between the reflective electrodes and the second electrodes of the three sub-pixels are different, the micro-cavity structures of the three sub-pixels have different cavity lengths. According to the formula of a micro-cavity optical path difference, the micro-cavity length d is proportional to the wavelength $\lambda$ of the emitted light. By designing the distance between the reflective electrode and the second electrode (i.e. the micro-cavity length) in the sub-pixel, the emission of light near the wavelength corresponding to the resonant wavelength of the micro-cavity length in each sub-pixel can be enhanced, while the light of other wavelengths not corresponding to the resonant wavelength is weakened, so that the sub-pixel mainly emits light of corresponding color through the strong micro-cavity effect.

Taking an example in which the first color light is red (R) light, the second color light is green (G) light and the third color light is blue (B) light, the first sub-pixel 101 emits red light, the second sub-pixel 102 emits green light, and the third sub-pixel 103 emits blue light. In one structure, the emitting layer in the first sub-pixel 101 emits white light. After the white light passes through the red color filter, the green light and the blue light are filtered out, and only the red light, which accounts for about one third of the white light, passes out, and this causes large loss of light energy. In the present disclosure, since a micro-cavity structure is formed in the first sub-pixel 101, and the micro-cavity length and the red light wavelength satisfy a micro-cavity optical path difference relation, the spectrum and intensity of emitted red light are enhanced, so that the emitting layer of the first sub-pixel 101 mainly emits red light. In this way, only a small part of the green light and blue light are filtered out after the light emitted from the emitting layer passes through the red color filter, the red light, which accounts for more than two thirds of the light emitted from the emitting layer, passes out, and this causes little loss of light energy. Similarly, in an existing structure, the emitting layer in the second sub-pixel 102 emits white light. After the white light passes through the green color filter, only green light, which accounts for about one third of the white light, passes out, and this causes large loss of light energy. In the present disclosure, since a micro-cavity structure is formed in the second sub-pixel 102, and the micro-cavity length and the green light wavelength satisfy a micro-cavity optical path difference relation, the spectrum and intensity of emitted green light are enhanced, so that the emitting layer of the second sub-pixel 102 mainly emits green light. In this way, after the light emitted from the emitting layer passes through the green color filter, the green light, which accounts for more than two thirds of the light emitted from the emitting layer, passes out, and this causes little loss of light energy. Similarly, in an existing structure, the emitting layer in the third sub-pixel 103 emits white light. After the white light passes through the blue filter, only blue light, which accounts for about one third of the white light, passes out, and this causes large loss of light energy. In the present disclosure, since a micro-cavity structure is formed in the third sub-pixel 103, and the micro-cavity length and the blue light wavelength satisfy a micro-cavity optical path difference relation, the spectrum and intensity of emitted blue light are enhanced, so that the emitting layer of the third sub-pixel 103 mainly emits blue light. In this way, after the light emitted from the emitting layer passes through the blue color filter, the blue light, which accounts for more than two thirds of the light emitted from the emitting layer, passes out, and this causes little loss of light energy. According to the present disclosure, micro-cavity effect gains of different sub-pixels are achieved by designing reasonable micro-cavity lengths, the loss of light energy is reduced to the greatest extent, the color gamut and brightness of emitted light are improved, and higher color gamut and brightness are obtained.

In addition, preparation of the display substrate in the present disclosure may adopt the existing mature process equipment and process flow, does not need an integrated circuit foundry, and does not need to adopt an FMM process which is expensive, thus effectively reducing the production cost. In addition, the structure of the combination of an OLED and a CF can meet the requirement of high PPI. By adjustment of the stacked structure of each reflective electrode in the display substrate, RGB in the white OLED can respectively have their own micro-cavity optical paths, and this achieves the light modulation effect of a single sub-pixel under the condition of satisfaction of the cavity micro-cavity effect. The process has good compatibility, high realizability, and strong practicability.

In the first metal film, the second metal film, and the third metal film, metal materials may be used, and in exemplary embodiments, an aluminum (AL) or aluminum alloy material may be used. In the first modulation film, the second modulation film, and the third modulation film, silicon oxide (SiOx) or silicon nitride (SiNx) may be used, and in an exemplary embodiment, silicon dioxide (SiO2) may be used. In an exemplary embodiment, a tungsten injection method may be adopted in the filling processing, and a chemical mechanical polishing (CMP) method may be adopted in the polishing process. In some possible implementations, the micro-cavity length may be provided according to actual needs, and the micro-cavity lengths required by different colors of light when a strong micro-cavity effect is formed may be calculated through optical simulation. In addition, the position of the emitting layer may be disposed to satisfy that phase variation of round-trip optical paths between the emitting layer and the reflective electrode is integer times of $2n$, to obtain enhanced interference and optimize emitted light.

Figure 18:
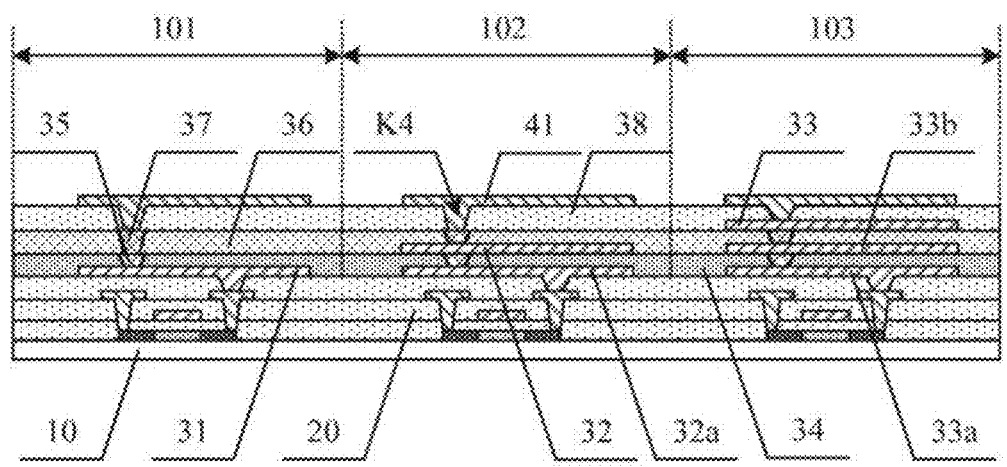
FIG. 18 is a schematic structural diagram of another display substrate according to the present disclosure.

FIG. 18 is a schematic structural diagram of another display substrate according to the present disclosure. As shown in FIG. 18, other structures of the display substrate in this embodiment are similar to the corresponding structures described in the aforementioned embodiments, except following differences: the third connection block is not disposed in a fourth via K4 of each sub-pixel, the first electrode 41 of the emitting structure layer of the first sub-pixel 101 is directly connected with the second connection block 37 of the first sub-pixel through a fourth via K4 disposed in the third modulation layer 38, the first electrode 41 of the second sub-pixel 102 is directly connected with the second connection block 37 of the second sub-pixel through a fourth via K4, and the first electrode 41 of the third sub-pixel 103 is directly connected with a third reflective electrode 33 of the third sub-pixel through a fourth via K4.

The preparation process of the display panel in this embodiment is similar to the preparation process described in the aforementioned embodiments, except the following differences: after act (11), the filling processing and polishing treatment are not performed, and act (13) is directly performed, so that the first electrode 41 formed in the first sub-pixel 101 is connected with the second connection block 37 of the first sub-pixel through a fourth via, the first electrode 41 formed in the second sub-pixel 102 is connected with the second connection block 37 of the second sub-pixel through a fourth via, and the first electrode 41 formed in the third sub-pixel 103 is connected with the third reflective electrode 33 of the third sub-pixel through a fourth via. In some possible implementations, when the thicknesses of the first modulation layer and the second modulation layer are relatively thin, the second via and the third via may not be filled with the connection blocks, and the upper and lower layers of metal are directly connected through a via.

In the present disclosure, the filling processing and polishing treatment are canceled, and the preparation process is simplified. Due to reduction of opaque connection blocks, an aperture ratio can be improved.

Figure 19:
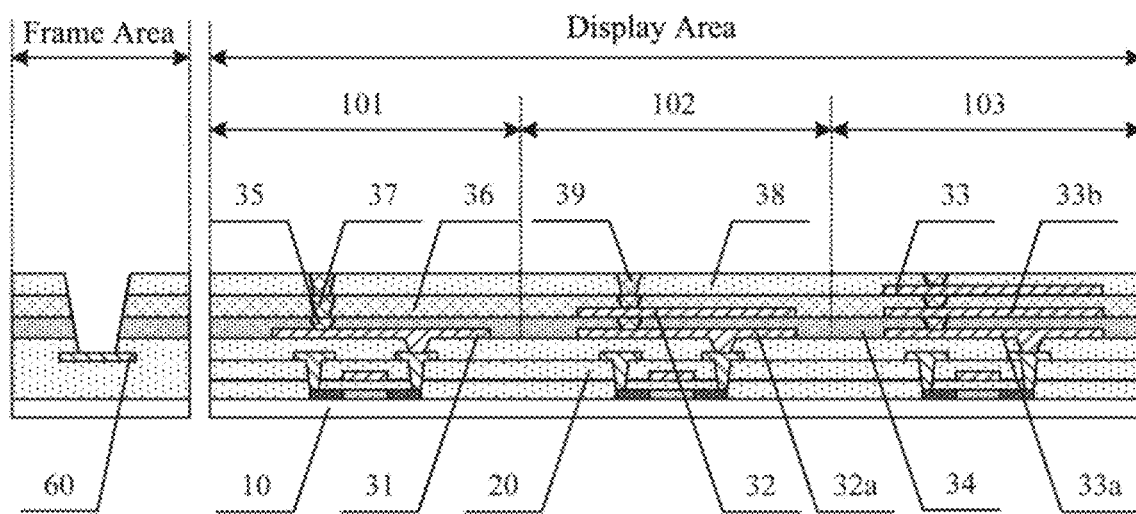
FIG. 19 is a schematic structural diagram of still another display substrate according to the present disclosure.

FIG. 19 is a schematic structural diagram of still another display substrate according to the present disclosure. As shown in FIG. 19, the display substrate of the present disclosure includes a display area and a frame area. The structure of the display area is similar to the structure described in any one of the foregoing embodiments. The frame area includes a lead structure layer, and the lead structure layer includes a lead pad 60 disposed on the same layer as the drain electrode 22 of the driving transistor 21 and formed in the same patterning process. The lead structure layer is covered with the first modulation layer 34, the second modulation layer 36 and the third modulation layer 38, and the modulation layers are provided with lead vias exposing the lead pad 60.

The preparation process of the display substrate in this embodiment is similar to the preparation process described in the aforementioned embodiments, except the following differences: after the third connection block pattern is formed and polished in act (12), the lead vias are prepared first, and then the first electrode pattern is formed in act (13). Alternatively, when the fourth vias of the third modulation layer is formed in act (11), the lead vias is simultaneously formed in the frame area.

The present disclosure further provides a preparation method of a display substrate. In an exemplary embodiment, the preparation method of the display substrate includes: forming sequentially a micro-cavity modulation layer and an emitting structure layer in each of sub-pixels. The micro-cavity modulation layer has a reflective electrode formed therein, the emitting structure layer includes a first electrode, an emitting layer and a semi-transparent and semi-reflective second electrode which are sequentially formed on the micro-cavity modulation layer, and a distance between the second electrode and the reflection electrode is made different in each sub-pixel.

In some possible implementations, the preparation method of the display substrate further includes: forming a driving circuit layer on a silicon substrate, wherein the driving circuit layer includes a driving transistor, the micro-cavity modulation layer is formed on the driving circuit layer, the reflective electrode is connected with a drain electrode of the driving circuit layer, the emitting structure layer is formed on the micro-cavity modulation layer, and the first electrode of the emitting structure layer is connected with the reflective electrode.

In some possible implementations, the pixel unit includes a first sub-pixel, a second sub-pixel and a third sub-pixel.

Forming the micro-cavity modulation layer includes: forming a first reflective electrode and two first connection electrodes on the driving circuit layer, wherein the first reflective electrode is formed in the first sub-pixel and is connected with a drain electrode of a driving transistor through a first via provided in the driving circuit layer, and the two first connection electrodes are respectively formed in the second sub-pixel and the third sub-pixel and are connected with drain electrodes of driving transistors respectively through first vias provided in the driving circuit layer.

Forming the micro-cavity modulation layer further includes: forming a first modulation layer covering the first reflective electrode and the two first connection electrodes, wherein each sub-pixel has a second via formed on the first modulation layer, a second via of the first sub-pixel exposes the first reflective electrode, and second vias of the second sub-pixel and the third sub-pixel expose the first connection electrodes.

Forming the micro-cavity modulation layer further includes: forming a first connection block in each sub-pixel's second via, wherein the first reflective electrode is connected with a first connection block of the first sub-pixel, and the two first connection electrodes are connected with a first connection block of the second sub-pixel and a first connection block of the third sub-pixel respectively.

Forming the micro-cavity modulation layer further includes: forming a second reflective electrode and a second connection electrode on the first modulation layer, wherein the second reflective electrode is formed in the second sub-pixel and connected with the first connection block of the second sub-pixel, and the second connection electrode is formed in the third sub-pixel and connected with the first connection block of the third sub-pixel.

Forming the micro-cavity modulation layer further includes: forming a second modulation layer covering the second reflective electrode and the second connection electrode, wherein each sub-pixel has a third via formed on the second modulation layer, a third via of the first sub-pixel exposes the first connection block of the first sub-pixel, a third via of the second sub-pixel exposes the second reflective electrode, and a third via of the third sub-pixel exposes the second connection electrode.

Forming the micro-cavity modulation layer further includes: forming a second connection block in each sub-pixel's third via, wherein the first connection block is connected with a second connection block of the first sub-pixel, the reflective electrode is connected with a second connection block of the second sub-pixel, and the second connection electrode is connected with a second connection block of the third sub-pixel.

Forming the micro-cavity modulation layer further includes: forming a third reflective electrode on the second modulation layer, wherein the third reflective electrode is formed in the third sub-pixel and connected with the second connection block of the third sub-pixel.

Forming the micro-cavity modulation layer further includes: forming a third modulation layer covering the third reflective electrode, wherein each sub-pixel has a fourth via formed on the third modulation layer, a fourth via of the first sub-pixel and a fourth via of the second sub-pixel respectively expose the second connection block of the first sub-pixel and the second connection block of the second sub-pixel, and a fourth via of the third sub-pixel exposes the third reflective electrode.

In some possible implementations, forming the micro-cavity modulation layer further includes any one or more of the following: forming a third connection block in the fourth via of the first sub-pixel, wherein the third connection block is connected with the second connection block of the first sub-pixel; forming a third connection block in the fourth via of the second sub-pixel, wherein the third connection block is connected with the second connection block of the second sub-pixel; and forming a third connection block in the fourth via of the third sub-pixel, wherein the third connection block is connected with the third reflective electrode of the third sub-pixel.

In some possible implementations, forming the emitting structure layer includes: forming first electrodes on the third modulation layer, wherein the second connection block of the first sub-pixel is connected with a first electrode of the first sub-pixel through the fourth via of the first sub-pixel, the second connection block of the second sub-pixel is connected with a first electrode of the second sub-pixel through the fourth via of the second sub-pixel, and the third reflective electrode is connected with a first electrode of the third sub-pixel through the fourth via of the third sub-pixel; and forming sequentially the emitting layer and the second electrode.

In some possible implementations, forming the emitting structure layer includes: forming first electrodes on the third modulation layer, wherein each sub-pixel has a first electrode connected with its third connection block; and forming sequentially the emitting layer and the second electrode.

In some possible implementations, forming the first connection block in each sub-pixel's second via, includes: filling a conductive material in each sub-pixel's second via through a filling processing to form the first connection block; and treating surfaces of the first modulation layer and the first connection block using a polishing process to form a flat surface on the first modulation layer and the first connection block.

In some possible implementations, forming the second connection block in each sub-pixel's third via includes: filling a conductive material in each sub-pixel's third via through a filling processing to form the second connection block; and treating surfaces of the second modulation layer and the second connection block using a polishing process to form a flat surface on the second modulation layer and the second connection block.

In some possible implementations, forming the third connection block in each sub-pixel's fourth via includes: filling a conductive material in each sub-pixel's fourth via through a filling processing to form the third connection block; and treating surfaces of the third modulation layer and the third connection block using a polishing process to form a flat surface on the third modulation layer and the third connection block.

In some possible implementations, the emitting layer is an emitting layer that emits white light; and the preparation method further includes: forming a color filter layer on the emitting structure layer.

The present disclosure provides a preparation method of a display substrate. According to the preparation method of the display substrate, reflective electrodes are disposed, and a distance between a reflective electrode and second electrode is different in each sub-pixel, so that each sub-pixel forms a micro-cavity structure with a different cavity length, and emitting layers of different sub-pixels enhance emission of light rays near wavelengths corresponding to cavity lengths under a strong micro-cavity effect, thereby obtaining higher color gamut and brightness. The preparation method of the display substrate in the present disclosure may adopt the existing mature process equipment and process flow, does not need an integrated circuit foundry, and does not need to adopt an FMM process which is expensive, thus effectively reducing the production cost. By adjustment of the stacked structure of each reflective electrode in the display substrate, RGB in the white OLED can respectively have their own micro-cavity optical paths, and this achieves the light modulation effect of a single sub-pixel under the condition of satisfaction of the cavity micro-cavity effect. The process has good compatibility, high realizability, and strong practicability.

The present disclosure further provides a display device including any one of the aforementioned display substrates. As an OLED-on-silicon microdisplay, the display device may be applied to any one or more of: a helmet-mounted display, a stereoscopic display mirror and a glasses type display.

In the description of the present disclosure, it should be understood that azimuth or positional relationships indicated by terms "middle", "upper", "lower", "front", "rear", "vertical", "horizontal", "top", "bottom", "inside", "outside" and the like is based on the azimuth or positional relationship shown in the drawings, which is only for ease of description of the present disclosure and simplification of the description, rather than indicating or implying that the device or element referred to must have a specific orientation, or must be constructed and operated in a particular orientation, and therefore cannot be construed as limiting the present disclosure.

In the description of the present disclosure, it should be understood that unless otherwise clearly specified and defined, the terms "install", "connect", "link", "fix" and other terms should be broadly interpreted, for example, it may be connected fixedly or connected detachably, or integrated; it may be a mechanical connection or an electrical connection; it may be directly connected, or may be indirectly connected through an intermediary, it may be an internal connection between two elements or an interaction between two elements, unless otherwise clearly specified. Those of ordinary skilled in the art can understand the specific meanings of the above terms in the present disclosure according to specific situations.

Although embodiments of the present disclosure are described in the above, the above embodiments are described only for better understanding, rather than restricting the present disclosure. Any person skilled in the field to which the present disclosure pertains can make any modifications and variations in the forms and details of implementation without departing from the spirit and the scope disclosed in the present disclosure, but the patent protection scope of the present application should still be subject to the scope defined by the appended claims.

What we claim is:

1. A display substrate, comprising a plurality of pixel units arranged in a matrix, wherein the pixel units each comprise a plurality of sub-pixels, the sub-pixels each comprise a silicon substrate and a micro-cavity modulation layer and an emitting structure layer, the micro-cavity modulation layer is provided with a reflective electrode, the emitting structure layer comprises a first electrode, an emitting layer and a semi-transparent and semi-reflective second electrode which are sequentially disposed on the micro-cavity modulation layer, and distance between the second electrode and the reflective electrode is different in each sub-pixel; wherein
the pixel units each comprise a first sub-pixel, a second sub-pixel and a third sub-pixel adjacently arranged;
the first sub-pixel, the second sub-pixel and the third sub-pixel respectively comprise a first reflective electrode, a second reflective electrode and a third reflective electrode;
each of the second reflective electrode and the third reflective electrode is electrically connected to a drive transistor through a first connection electrode provided in a same layer as the first reflective electrode;
in the first sub-pixel, an orthographic projection of the drive transistor on the silicon substrate is located within an orthographic projection of the first reflective electrode on the silicon substrate;
in each of the second sub-pixel and the third sub-pixel, an orthographic projection of the drive transistor on the silicon substrate is located within an orthographic projection of the first connecting electrode on the silicon substrate;
wherein the sub-pixels each further comprise a driving circuit layer disposed on the silicon substrate, the micro-cavity modulation layer is disposed on the driving circuit layer, the driving circuit layer comprises the driving transistor having a drain electrode;
the micro-cavity modulation layer of the first sub-pixel comprises:
the first reflective electrode disposed on the driving circuit layer, wherein the first reflective electrode is connected with the drain electrode of the driving circuit layer through a first via provided in the driving circuit layer;
a first modulation layer covering the first reflective electrode, wherein the first modulation layer is provided with a second via exposing the first reflective electrode;
a first connection block disposed in the second via, wherein the first connection block is connected with the first reflective electrode;
a second modulation layer covering the first modulation layer and the first connection block, wherein the second modulation layer is provided with a third via exposing the first connection block;
a second connection block disposed in the third via, wherein the second connection block is connected with the first connection block; and
a third modulation layer covering the second modulation layer and the second connection block, wherein the third modulation layer is provided with a fourth via exposing the second connection block.

2. The display substrate according to claim 1, wherein the micro-cavity modulation layer of the second sub-pixel comprises:
the first connection electrode disposed on the driving circuit layer, wherein the first connection electrode is connected with the drain electrode of the driving circuit layer through the first via provided in the driving circuit layer;
the first modulation layer covering the first connection electrode, wherein the first modulation layer is provided with the second via exposing the first connection electrode;
the first connection block disposed in the second via, wherein the first connection block is connected with the first connection electrode;
the second reflective electrode disposed on the first modulation layer, wherein the second reflective electrode is connected with the first connection block;
the second modulation layer covering the second reflective electrode, wherein the second modulation layer is provided with the third via exposing the second reflective electrode;
the second connection block disposed in the third via, wherein the second connection block is connected with the second reflective electrode; and
the third modulation layer covering the second modulation layer and the second connection block, wherein the third modulation layer is provided with the fourth via exposing the second connection block.

3. The display substrate according to claim 1, wherein the micro-cavity modulation layer of the third sub-pixel comprises:
the first connection electrode disposed on the driving circuit layer, wherein the first connection electrode is connected with the drain electrode of the driving circuit layer through the first via provided in the driving circuit layer;
the first modulation layer covering the first connection electrode, wherein the first modulation layer is provided with the second via exposing the first connection electrode;
the first connection block disposed in the second via, wherein the first connection block is connected with the first connection electrode;
the second modulation layer covering the first modulation layer and the first connection block, wherein the second modulation layer is provided with the third via exposing the first connection block;
the second connection block disposed in the third via, wherein the second connection block is connected with the first connection block;
the third reflective electrode disposed on the second modulation layer, wherein the third reflective electrode is connected with the second connection block; and
the third modulation layer covering the third reflective electrode, wherein the third modulation layer is provided with the fourth via exposing the third reflective electrode.

4. The display substrate according to claim 1, further comprising a third connection block disposed in the fourth via of the first sub-pixel, wherein the third connection block is connected with the second connection block of the first sub-pixel.

5. The display substrate according to claim 2, wherein the display substrate further comprises a third connection block disposed in the fourth via of the second sub-pixel, and the third connection block is connected with the second connection block of the second sub-pixel.

6. The display substrate according to claim 3, wherein the display substrate further comprises a third connection block disposed in the fourth via of the third sub-pixel, and the third connection block is connected with the third reflective electrode of the third sub-pixel.

7. The display substrate according to claim 1, wherein the emitting layer is an emitting layer that emits white light; and the sub-pixel further comprises a color filter layer disposed on the emitting structure layer.

8. A display device, comprising the display substrate according to claim 1.

9. A preparation method of a display substrate comprising a plurality of pixel units arranged in a matrix, wherein the pixel units each comprise a plurality of sub-pixels, and the method comprises:
   forming sequentially a silicon substrate, a micro-cavity modulation layer and an emitting structure layer in each of the sub-pixels, wherein the micro-cavity modulation layer has a reflective electrode formed therein, and the emitting structure layer comprises a first electrode, an emitting layer and a semi-transparent and semi-reflective second electrode which are sequentially formed on the micro-cavity modulation layer, and making a distance between the second electrode and the reflection electrode different in each sub-pixel; wherein
   the pixel units each comprise a first sub-pixel, a second sub-pixel and a third sub-pixel adjacently arranged;
   the first sub-pixel, the second sub-pixel and the third sub-pixel respectively comprise a first reflective electrode, a second reflective electrode and a third reflective electrode;
   each of the second reflective electrode and the third reflective electrode is electrically connected to a drive transistor through a first connection electrode provided in a same layer as the first reflective electrode;
   in the first sub-pixel, an orthographic projection of the drive transistor on the silicon substrate is located within an orthographic projection of the first reflective electrode on the silicon substrate;
   in each of the second sub-pixel and the third sub-pixel, an orthographic projection of the drive transistor on the silicon substrate is located within an orthographic projection of the first connecting electrode on the silicon substrate;
   the preparation method comprises: forming a driving circuit layer on the silicon substrate, wherein the driving circuit layer comprises the driving transistor having a drain electrode, the micro-cavity modulation layer is formed on the driving circuit layer, and the emitting structure layer is formed on the micro-cavity modulation layer;
   wherein forming the micro-cavity modulation layer comprises:
   forming the first reflective electrode and the first connection electrode on the driving circuit layer, wherein the first reflective electrode is formed in the first sub-pixel and is connected with a drain electrode of the driving transistor through a first via provided in the driving circuit layer, and the first connection electrode is formed in each of the second sub-pixel and the third sub-pixel and is connected with a drain electrode of the driving transistor through a first via provided in the driving circuit layer;
   forming a first modulation layer covering the first reflective electrode and the first connection electrode, wherein each sub-pixel has a second via formed on the first modulation layer, a second via of the first sub-pixel exposes the first reflective electrode, and each of second vias of the second sub-pixel and the third sub-pixel exposes the first connection electrode;
   forming a first connection block in each sub-pixel's second via, wherein the first reflective electrode is connected with a first connection block of the first sub-pixel, and the first connection electrode of the second sub-pixel and the first connection electrode of the third sub-pixel are connected with a first connection block of the second sub-pixel and a first connection block of the third sub-pixel respectively;
   forming the second reflective electrode and a second connection electrode on the first modulation layer, wherein the second reflective electrode is formed in the second sub-pixel and connected with the first connection block of the second sub-pixel, and the second connection electrode is formed in the third sub-pixel and connected with the first connection block of the third sub-pixel;
   forming a second modulation layer covering the second reflective electrode and the second connection electrode, wherein each sub-pixel has a third via formed on the second modulation layer, a third via of the first sub-pixel exposes the first connection block of the first sub-pixel, a third via of the second sub-pixel exposes the second reflective electrode, and a third via of the third sub-pixel exposes the second connection electrode;
   forming a second connection block in each sub-pixel's third via, wherein the first connection block is connected with a second connection block of the first sub-pixel, the reflective electrode is connected with a second connection block of the second sub-pixel, and the second connection electrode is connected with a second connection block of the third sub-pixel;
   forming the third reflective electrode on the second modulation layer, wherein the third reflective electrode is formed in the third sub-pixel and connected with the second connection block of the third sub-pixel; and
   forming a third modulation layer covering the third reflective electrode, wherein each sub-pixel has a fourth via formed on the third modulation layer, a fourth via of the first sub-pixel and a fourth via of the second sub-pixel respectively expose the second connection block of the first sub-pixel and the second connection block of the second sub-pixel, and a fourth via of the third sub-pixel exposes the third reflective electrode.

10. The preparation method according to claim 9, wherein forming the micro-cavity modulation layer further comprises any one or more of the following:
   forming a third connection block in the fourth via of the first sub-pixel, wherein the third connection block is connected with the second connection block of the first sub-pixel;
   forming the third connection block in the fourth via of the second sub-pixel, wherein the third connection block is connected with the second connection block of the second sub-pixel; and
   forming the third connection block in the fourth via of the third sub-pixel, wherein the third connection block is connected with the third reflective electrode of the third sub-pixel.

11. The preparation method according to claim 9, wherein forming the emitting structure layer comprises:
   forming first electrodes on the third modulation layer, wherein the second connection block of the first sub-pixel is connected with a first electrode of the first sub-pixel through the fourth via of the first sub-pixel, the second connection block of the second sub-pixel is connected with a first electrode of the second sub-pixel through the fourth via of the second sub-pixel, and the third reflective electrode is connected with a first electrode of the third sub-pixel through the fourth via of the third sub-pixel; and forming sequentially the emitting layer and the second electrode.

12. The preparation method according to claim 10, wherein forming the emitting structure layer comprises:

forming first electrodes on the third modulation layer, wherein each sub-pixel has a first electrode connected with its third connection block; and forming sequentially the emitting layer and the second electrode.

13. The preparation method according to claim 9, wherein, forming the first connection block in each sub-pixel's second via, comprises: filling a conductive material in each sub-pixel's second via through a filling processing to form the first connection block; and treating surfaces of the first modulation layer and the first connection block using a polishing process to form a flat surface on the first modulation layer and the first connection block.

14. The preparation method according to claim 9, wherein, forming the second connection block in each sub-pixel's third via, comprises: filling a conductive material in each sub-pixel's third via through a filling processing to form the second connection block; and treating surfaces of the second modulation layer and the second connection block using a polishing process to form a flat surface on the second modulation layer and the second connection block.

15. The preparation method according to claim 10, wherein, forming the third connection block in each sub-pixel's fourth via comprises: filling a conductive material in each sub-pixel's fourth via through a filling processing to form the third connection block; and treating surfaces of the third modulation layer and the third connection block using a polishing process to form a flat surface on the third modulation layer and the third connection block.

16. The preparation method according to claim 9, wherein the emitting layer is an emitting layer that emits white light; and the preparation method further comprises: forming a color filter layer on the emitting structure layer.

* * * * *